United States Patent
Noma et al.

(10) Patent No.: US 7,312,521 B2
(45) Date of Patent: Dec. 25, 2007

(54) SEMICONDUCTOR DEVICE WITH HOLDING MEMBER

(75) Inventors: Takashi Noma, Ota (JP); Hiroyuki Shinogi, Gunma (JP); Nobuyuki Takai, Saitama (JP); Katsuhiko Kitagawa, Gunma (JP); Ryoji Tokushige, Gunma (JP); Takayasu Otagaki, Hashima (JP); Tatsuya Ando, Hashima (JP); Mitsuru Okigawa, Nagoya (JP)

(73) Assignee: Sanyo Electric Co., Ltd., Osaka (JP)

( * ) Notice: Subject to any disclaimer, the term of this patent is extended or adjusted under 35 U.S.C. 154(b) by 32 days.

(21) Appl. No.: 10/420,943

(22) Filed: Apr. 23, 2003

(65) Prior Publication Data

US 2003/0230805 A1   Dec. 18, 2003

(30) Foreign Application Priority Data

Apr. 23, 2002 (JP) .................................... 2002-120369
Jun. 26, 2002 (JP) .................................... 2002-185749

(51) Int. Cl.
*H01L 23/48* (2006.01)
*H01L 23/12* (2006.01)
*H01L 29/70* (2006.01)
*H01L 31/02* (2006.01)
*H01L 23/04* (2006.01)

(52) U.S. Cl. ....................... 257/698; 257/734; 257/738; 257/758; 257/782; 257/783; 257/784; 257/621; 257/666; 257/698; 257/692; 257/684; 257/693; 438/64; 438/109

(58) Field of Classification Search ................ 257/784, 257/783, 782, 738, 737, 684, 734, 758, 621, 257/692, 693, 666; 438/64, 109
See application file for complete search history.

(56) References Cited

U.S. PATENT DOCUMENTS

| | | | |
|---|---|---|---|
| 3,648,131 | A | 3/1972 | Stuby |
| 3,787,252 | A | 1/1974 | Filippazzi et al. |
| 4,954,875 | A | 9/1990 | Clements |

(Continued)

FOREIGN PATENT DOCUMENTS

| | | |
|---|---|---|
| FR | 2 767 233 | 2/1999 |
| JP | H-09-46566 | 2/1997 |
| JP | 2001-77229 | 3/2001 |
| JP | 2002-93942 | 3/2002 |
| JP | 2002-231918 | 8/2002 |
| JP | 2002-329849 | 11/2002 |
| KR | 10-0410812 B1 | 1/2004 |
| WO | WO 99/40624 A1 | 8/1999 |

OTHER PUBLICATIONS

European Search Report EP 03 01 0938.
European Office Action dated Aug. 10, 2005 issued in EP Application No. 030109388.3.
Office Action mailed Apr. 10, 2006, directed to EP Application No. 0301938.3.

*Primary Examiner*—Alexander Oscar Williams
(74) *Attorney, Agent, or Firm*—Morrison & Foerster LLP

(57) ABSTRACT

Cost is reduced and reliability is improved with a BGA (Ball Grid Array) type semiconductor device which has ball-shaped conductive terminals. A first wiring is formed on an insulation film which is formed on a surface of a semiconductor die. A glass substrate is bonded over the surface of the semiconductor die, and a side surface and a back surface of the semiconductor die are covered with an insulation film. A second wiring is connected to a side surface or a back surface of the first wiring and extending over the back surface of the semiconductor die. A conductive terminal such as a bump is formed on the second wiring.

10 Claims, 15 Drawing Sheets

U.S. PATENT DOCUMENTS

| | | | |
|---|---|---|---|
| 5,229,647 A | | 7/1993 | Gnadinger |
| 5,476,819 A | | 12/1995 | Warren |
| 5,648,684 A | * | 7/1997 | Bertin et al. ............... 257/685 |
| 5,682,062 A | | 10/1997 | Gaul |
| 5,895,234 A | * | 4/1999 | Taniguchi et al. .......... 438/111 |
| 5,895,970 A | * | 4/1999 | Miyoshi .................... 257/696 |
| 5,910,687 A | | 6/1999 | Chen et al. |
| 5,998,866 A | * | 12/1999 | Ochi et al. ................. 257/727 |
| 6,002,163 A | | 12/1999 | Wojnarowski |
| 6,054,760 A | * | 4/2000 | Martinez-Tovar et al. .. 257/692 |
| 6,184,060 B1 | | 2/2001 | Siniaguine |
| 6,221,751 B1 | * | 4/2001 | Chen et al. ................ 438/612 |
| 6,326,689 B1 | * | 12/2001 | Thomas ..................... 257/734 |
| 6,358,772 B2 | * | 3/2002 | Miyoshi .................... 438/106 |
| 6,406,934 B1 | | 6/2002 | Glenn et al. |
| 6,424,031 B1 | * | 7/2002 | Glenn ....................... 257/686 |
| 6,433,418 B1 | * | 8/2002 | Fujisawa et al. ............ 257/696 |
| 6,485,814 B1 | | 11/2002 | Moriizumi et al. |
| 6,552,426 B2 | * | 4/2003 | Ishio et al. ................. 257/692 |
| 6,624,505 B2 | | 9/2003 | Badehi |
| 6,646,289 B1 | * | 11/2003 | Badehi ........................ 257/81 |
| 6,693,358 B2 | * | 2/2004 | Yamada et al. ............. 257/774 |
| 6,720,661 B2 | | 4/2004 | Hanaoka et al. |
| 6,781,244 B2 | | 8/2004 | Prabhu |
| 6,812,573 B2 | * | 11/2004 | Shimoishizaka et al. .... 257/759 |
| 6,828,175 B2 | | 12/2004 | Wood et al. |
| 6,848,177 B2 | | 2/2005 | Swan et al. |
| 6,894,386 B2 | * | 5/2005 | Poo et al. ................... 257/730 |
| 6,964,915 B2 | | 11/2005 | Farnworth et al. |
| 2002/0002587 A1 | | 2/2002 | Wada |
| 2002/0025587 A1 | | 2/2002 | Wada |
| 2002/0047210 A1 | * | 4/2002 | Yamada et al. ............. 257/774 |
| 2002/0105591 A1 | | 8/2002 | Nakamura et al. |
| 2002/0110953 A1 | | 8/2002 | Ahn et al. |
| 2002/0139577 A1 | * | 10/2002 | Miller ........................ 174/261 |
| 2002/0185725 A1 | * | 12/2002 | Moden et al. .............. 257/686 |
| 2003/0077878 A1 | | 4/2003 | Kumar et al. |
| 2003/0094683 A1 | | 5/2003 | Poo et al. |
| 2003/0134453 A1 | | 7/2003 | Prabhu et al. |
| 2003/0230805 A1 | | 12/2003 | Home et al. |
| 2004/0041260 A1 | | 3/2004 | Wood et al. |
| 2006/0079019 A1 | * | 4/2006 | Kim et al. |
| 2006/0270093 A1 | * | 11/2006 | Noma et al. ................ 438/64 |
| 2007/0026639 A1 | | 2/2007 | Noma et al. |
| 2007/0138498 A1 | * | 6/2007 | Zilber et al. ................. 257/99 |

\* cited by examiner

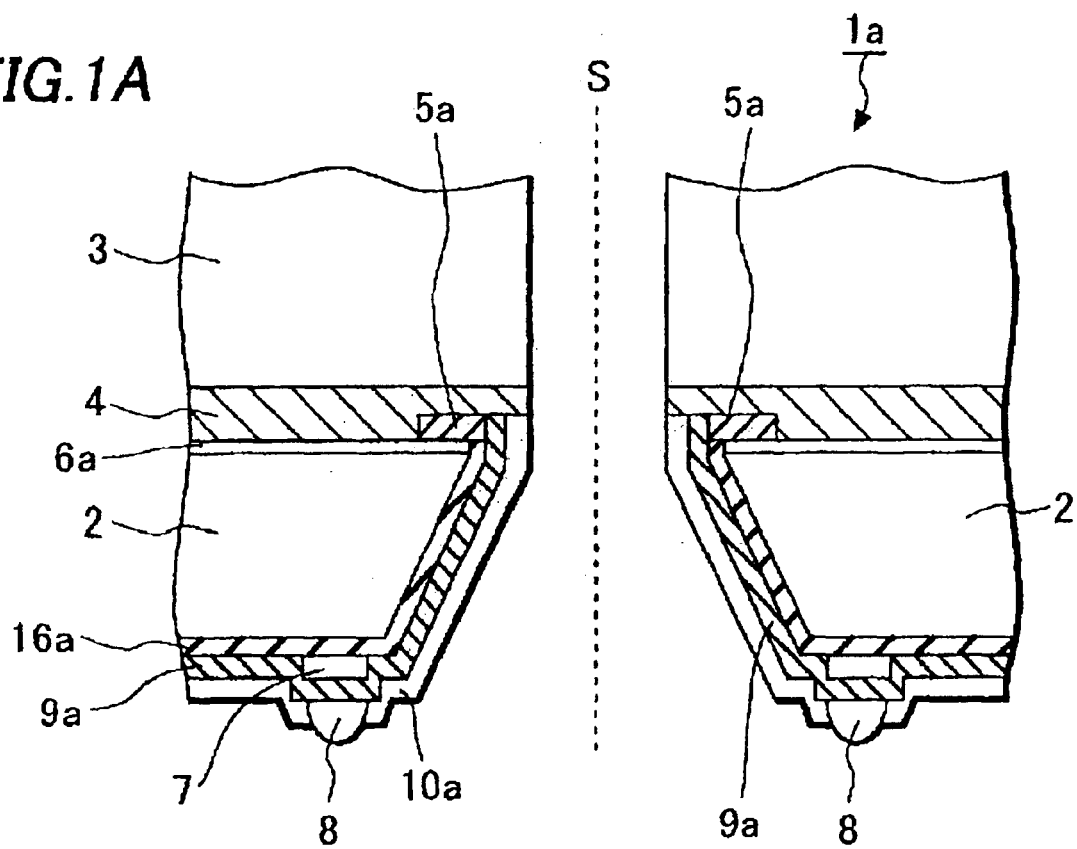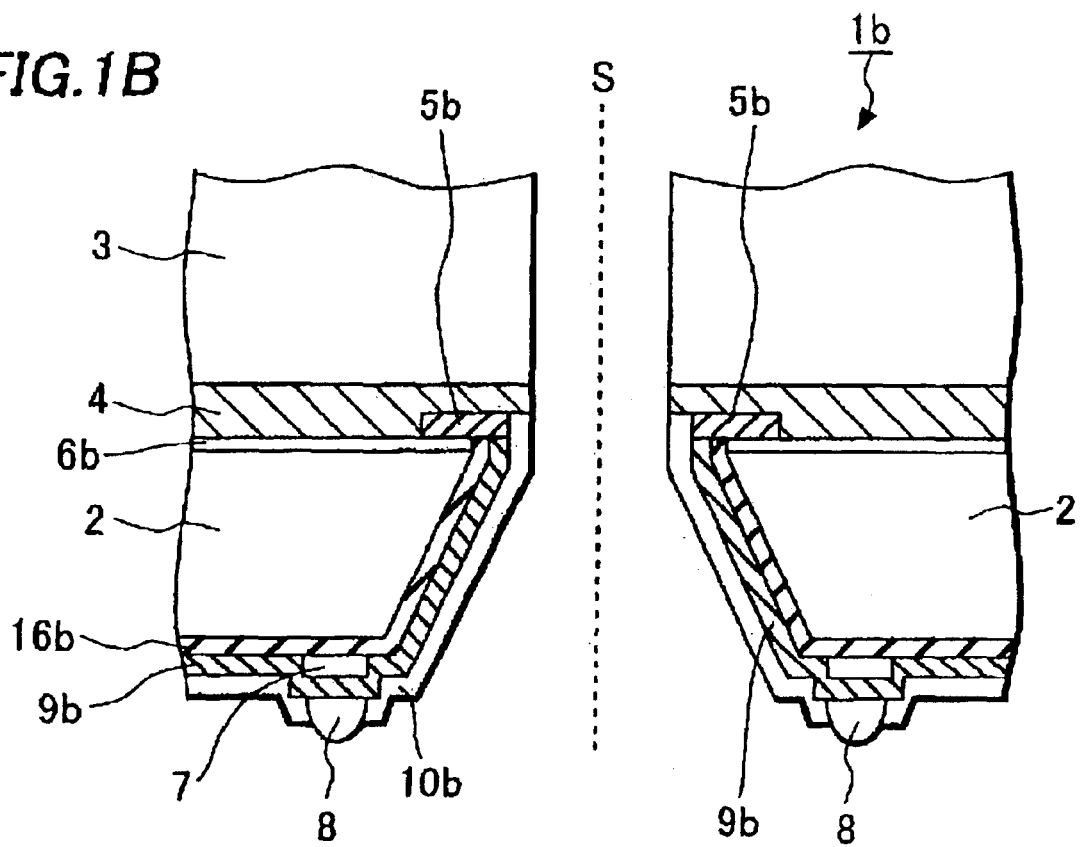

SEMICONDUCTOR DEVICE WITH HOLDING MEMBER

BACKGROUND OF THE INVENTION

1. Field of the Invention

This invention relates to a BGA (Ball Grid Array) type semiconductor device which has ball-shaped conductive terminals.

2. Description of the Related Art

A CSP (Chip Size Package) receives attention in recent years as a three-dimensional mounting technology as well as a new packaging technology. The CSP is a small package having about the same outside dimensions as those of a semiconductor die.

A BGA type semiconductor device has been known as a kind of CSP. A plurality of ball-shaped conductive terminals made of a metal such as solder is arrayed in a grid pattern on one principal surface of the BGA type semiconductor device and is electrically connected with the semiconductor die mounted on the other side of the package.

When the BGA type semiconductor device is mounted into electronic equipment, the semiconductor die and an external circuit on a printed circuit board are electrically connected by compression bonding of each of the conductive terminals to each of wiring patterns on the printed circuit board.

Such a BGA type semiconductor device has advantages in providing a large number of conductive terminals and in size reduction over other CSP type semiconductor devices such as an SOP (Small Outline Package) and a QFP (Quad Flat Package), which have lead pins protruding from their sides. The BGA type semiconductor device can be used, for example, as an image sensor chip for a digital camera incorporated into a mobile telephone.

FIG. 22A and FIG. 22B show an outline structure of a conventional BGA type semiconductor device. FIG. 22A is an oblique perspective figure of front side of the BGA type semiconductor device. And FIG. 22B is an oblique perspective figure of a back side of the BGA type semiconductor device.

A semiconductor die 104 is sealed between a first glass substrate 102 and a second glass substrate 103 through epoxy resins 105 and 105 in the BGA type semiconductor device. A plurality of ball-shaped terminals 106 is arrayed in a grid pattern on a principal surface of the second glass substrate 103, that is, on the back side of the BGA type semiconductor device 101.

The conductive terminals 106 are connected to the semiconductor die 104 through second wirings 110. The second wirings 110 is connected with aluminum wirings pulled out from inside of the semiconductor die 104, making each of the ball-shaped terminals 106 electrically connected with the semiconductor die 104.

Detailed explanation on a cross-sectional structure of the BGA type semiconductor device 101 will be given referring to FIG. 21. FIG. 21 shows a cross-sectional view of the BGA type semiconductor devices 101 divided along dicing lines into individual dice.

A first wiring 107 is provided on an insulation film 108 on a surface of the semiconductor die 104. The semiconductor die 104 is bonded on the first glass substrate 102 with the resin 105. A back side of the semiconductor die 104 is bonded on the second glass substrate 103 with the resin 105.

One end of the first wiring 107 is connected to the second wiring 110. The second wiring 110 extends from the end of the first wiring 107 to a surface of the second glass substrate 103. And the ball-shaped conductive terminal 106 is formed on the second wiring 110 extending onto the second glass substrate 103.

Next, a manufacturing process of the semiconductor device 101 will be explained in sequence, referring to FIG. 17 through FIG. 21.

A semiconductor wafer having a plurality of semiconductor dice 104 is provided and its surface is covered with an insulation film 108 made of insulating material such as $SiO_2$, as shown in FIG. 17. Then the first wirings 107 are formed on the insulation film 108 across borders (dicing lines) S along which the plurality of semiconductor dice 104 is to be cut into individual dice. Line S represents borders between the semiconductor dice 104.

After that, the first glass substrate 102 to hold the semiconductor dice 104 is bonded on the surface of the semiconductor dice 104, on which the first wirings 107 are formed, with the transparent epoxy resin 105.

After back grinding the semiconductor dice 104 to reduce thickness of the dice, the back surface of each of the semiconductor dice 104 and the insulation film 108 are etched along the borders S to expose the first wirings 107.

After that, the etched semiconductor dice 104, side surfaces of the insulation film 108 and exposed portions of the first wirings 107 are covered by the epoxy resin 105, and the second glass substrate 103 is bonded on the back surface of each of the semiconductor dice 104 using the epoxy resin 105 as a binder, as shown in FIG. 18.

Next, the second glass substrate 103 is performed a V-shaped notching along each of the borders S, as shown in FIG. 19. The notching is a cutting process using a cutting tool such as a blade. A V-shaped groove formed by the notching in this process reaches the first substrate 102. With this process, the first wiring 107 is separated into two portions, and their side surfaces are exposed.

An aluminum layer is formed to cover the second glass substrate 103 and cut surface formed by the notching, as shown in FIG. 20. The exposed surface of the first wiring 107 and the aluminum layer are thus connected. After that, the aluminum layer is subject to patterning to make a predetermined wiring pattern and form the second wiring 110.

Next, a protection film 111 such as a solder mask is formed on the second wiring 110, as shown in FIG. 21. Then the ball-shaped conductive terminal 106 is formed on the second wiring 110 through an opening in the protection film 111. Dicing along the borders S follows. With this, the conventional BGA type semiconductor device 101 is completed.

However, there are following problems in the above BGA type semiconductor device 101 and its manufacturing process.

First, the manufacturing process is complicated and expensive, since two glass substrates 102, 103 are used in the manufacturing process of the conventional BGA type semiconductor device 101.

Second, the notching, a peculiar process, is required to cut the first wirings 107, because the second glass substrate 103 is bonded on the back surface of each of the semiconductor dice 104. The notching causes abnormalities on the cut surface at the edge of the first wiring 107, such as incorporation of foreign material or contamination.

Third, there is a possibility that the side surface of the first wiring 107 and the second wiring 110 are disconnected when external stress is applied, because a length of contact between the side surface of the first wiring 107 and the second wiring 110 is only 2 μm to 3 μm. In addition, the side surface of the first wiring 107 is rough and poorly adheres to the second wiring 110, because the side surface of the first wiring 107 is a cut surface formed by notching.

This invention is directed to solve the problems addressed above, and offers a BGA type semiconductor device 101 at a reduced cost. This invention also improves the connection between the first wiring 107 and the second wiring 110 and offers a BGA type semiconductor device 101 of high reliability.

SUMMARY OF THE INVENTION

The invention provides a semiconductor device that includes a semiconductor die, a first insulation film disposed on a top surface of the semiconductor die, a first wiring portion disposed on the first insulation film, and a holding substrate disposed over the top surface of the semiconductor die and holding the semiconductor die. The device also includes a second insulation film having a side film and a back film. The side film is disposed on a side surface of the semiconductor die and the back film is disposed on a back surface of the semiconductor die. The device further includes a second wiring portion disposed on the side film and the back film and connected to the first wiring portion, and a conductive terminal formed on the second wiring.

The invention also provides a manufacturing method of a semiconductor device. The method includes providing a semiconductor wafer having a first die and a second die. A top surface of the wafer is covered by a first insulation film. The method also includes forming a first wiring portion on the first insulation film so that the first wiring portion is disposed above the first and second dice, bonding a holding substrate to the wafer so that the holding substrate faces the top surface of the wafer, and etching a back surface of the wafer along a border between the first and second dice to expose a part of the first wiring portion and to expose a side surface and a back surface of the first die and a side surface and a back surface of the second die. The method further includes forming a second insulation film on the exposed side surfaces and top surfaces of the first and second dice, etching the first wiring portion to cut the first wiring portion in two, and forming a second wiring portion on the second insulation film so that the second wiring portion is connected to one of the cut first wiring portions and extends to the back surface of the corresponding die. The method also includes forming a conductive terminal on the second wiring portion, and separating the first and second dice.

The invention further provides a manufacturing method of a semiconductor device. The method includes providing a semiconductor wafer having a first die and a second die. A top surface of the wafer is covered by a first insulation film. The method also includes forming a first top wiring portion and a second top wiring portion on the first insulation film so that the first and second top wiring portions are disposed above the first and second dice, respectively, bonding a holding substrate to the wafer so that the holding substrate faces the top surface of the wafer, and etching a back surface of the wafer along a border between the first and second dice to expose a part of the first top wiring portion and a part of the second top wiring portion and to expose a side surface and a back surface of the first die and a side surface and a back surface of the second die. The method further includes forming a second insulation film on the exposed side surfaces and top surfaces of the first and second dice, forming a first bottom wiring portion on the second insulation film so that the first bottom wiring portion is connected to the first top wiring portion and extends to the back surface of the first die, and forming a second bottom wiring portion on the second insulation film so that the second bottom wiring portion is connected to the second top wiring portion and extends to the back surface of the second die. The method also includes forming a first conductive terminal on the first bottom wiring portion, forming a second conductive terminal on the second bottom wiring portion, and separating the first and second dice.

BRIEF DESCRIPTION OF THE DRAWINGS

FIG. 1A is a cross-sectional view showing a semiconductor device according to a first embodiment of this invention, and FIG. 1B is a cross-sectional view showing a semiconductor device according to a second embodiment of this invention.

DETAILED DESCRIPTION OF THE INVENTION

Figure 2:
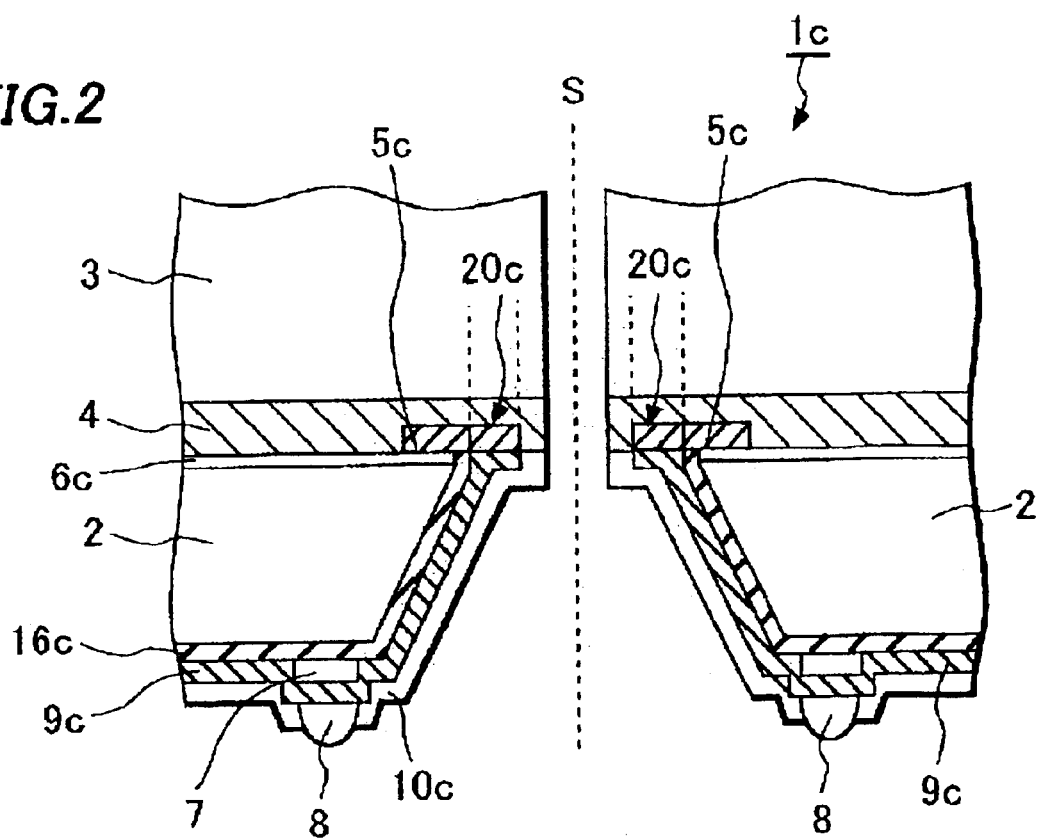
FIG. 2 is a cross-sectional view showing a semiconductor device according a third embodiment of this invention.

Next, embodiments of this invention will be explained referring to the drawings hereinafter.

FIG. 1A is a cross-sectional view showing a BGA type semiconductor device 1a according to a first embodiment of this invention. FIG. 1A shows two of BGA type semiconductor dice 2 formed on a semiconductor wafer, after dicing along the borders S. Each of the BGA type semiconductor devices 1a after dicing is identical with each other. Thus, the structure of one BGA type semiconductor device 1a will be explained hereinafter.

A first wiring 5a is formed on an insulation film 6a, which is formed on a surface of the semiconductor die 2. A glass substrate 3 is bonded on the surface of the semiconductor die 2, using a resin 4 as a binder. The insulation film 6a is formed of, for example, a silicon dioxide ($SiO_2$) film, a silicon nitride (SiN) film or an organic insulator film such as polyimide.

The semiconductor die 2 is an integrated circuit die such as a CCD image sensor, for example, and the semiconductor dice 2 is formed on the semiconductor wafer by a semiconductor manufacturing process. The glass substrate 3 is made of transparent glass material with a thickness of about 400

μm. The resin 4 is insulative and is made of a thermosetting epoxy resin, for example. The resin 4 is applied on the entire top surface of the semiconductor die 2 as a binder to bond the semiconductor die 2 and the glass substrate 3.

The first wiring 5a is a metal pad made of aluminum, an aluminum alloy or copper, and is electrically connected with a circuit element in the semiconductor die 2. The first wiring 5a is also called an extension pad, because it extends to the border S between the semiconductor dice 2.

The insulation film 16a is an insulation film covering a side surface and a back surface of the semiconductor die 2, and is formed of, for example, a silicon dioxide ($SiO_2$) film, a silicon nitride (SiN) film or an organic insulator film such as polyimide.

A plurality of cushions 7 made of a cushioning material is formed on predetermined locations on the insulation film 16a on the back surface of the semiconductor die 2. The cushions 7 are disposed under conductive terminals 8 and absorb a shock when the conductive terminals 8 are formed on Ni—Au plating placed on a second wiring 9a. The cushions 7 also function to increase height of the conductive terminals 8 to some extent.

The second wiring 9a is made of aluminum, aluminum alloy or copper, is formed on the surface of the insulation film 16a and the cushion 7, and is connected to a side surface of the first wiring 5a.

Length of contacting portion between the side surface of the first wiring 5a and the second wiring 9a is about 2 μm to 3 μm. The width of the contacting portion can be made broad, since the first wiring 5a is formed broad horizontally.

A ball-shaped conductive terminal 8 is formed on Ni—Au plating placed on the second wiring 9a through an opening in a protection film 10a which is formed on the second wiring 9a.

Next, a second embodiment of this invention will be explained referring to FIG. 1B. Difference between this embodiment and the first embodiment is in a structure of the contacting portion between the second wiring and the first wiring. That is, a portion of a back surface of a first wiring 5b contacts a second wiring 9b and is electrically connected with it according to this embodiment, while the side surface of the first wiring 5a contacts the second wiring 9a and is electrically connected with it according to the first embodiment. Length of the contacting portion between the second wiring 9b and the portion of the back surface of the first wiring 5b is about 2 μm to 3 μm.

Insulation films 6b and 16b and a protection film 10b in this embodiment correspond to the insulation films 6a and 16a and the protection film 10a in the first embodiment.

Since no second glass substrate is used in the first and the second embodiments, a semiconductor device with a reduced height is realized at a less cost than the conventional art accordingly.

And the first wiring 5a and the second wiring 5b can be separated by an etching process rather than by conventional cutting process using a blade, since the second glass substrate 103 is omitted. As a result, the side surfaces of the first wirings 5a, 5b are made smooth and clean to give better electrical and mechanical connection to the corresponding second wiring 9a, 9b, even though the length of the contacting portion is only 2 μm to 3 μm.

Next, a third embodiment of this invention will be explained referring to FIG. 2. The same symbols are assigned to the same components in the figure as in FIG. 1, and explanations on them are omitted.

In this embodiment, a contacting portion between a first wiring 5c and a second wiring 9c is formed wider compared with the second embodiment described above. Length of the contacting portion is typically 4 μm to 6 μm, or may be longer. That is to say, the first wiring 5c has a protruding portion 20c protruding outwardly from the semiconductor die 2 beyond an insulation film 16c, in order to obtain wider contacting portion between a back surface of the first wiring 5c and the second wiring 9c.

The second wiring 9c extends from the side surface of the semiconductor die 2 to the protruding portion 20c forming an L-shape, and contacts with the protruding portion 20c. The length of the contacting portion between the second wiring 9c and the protruding portion 20c is preferably longer than the length of the side surface of the first wiring 5c. Hence, electrical and mechanical connection between the first wiring 5c and the second wiring 9c can be further improved. Insulation films 6c and 16c and a protection film 10c in this embodiment correspond to the insulation films 6a and 16a and the protection film 10a in the first embodiment.

Next, a fourth embodiment of this invention will be explained referring to FIG. 3.

Figure 3:
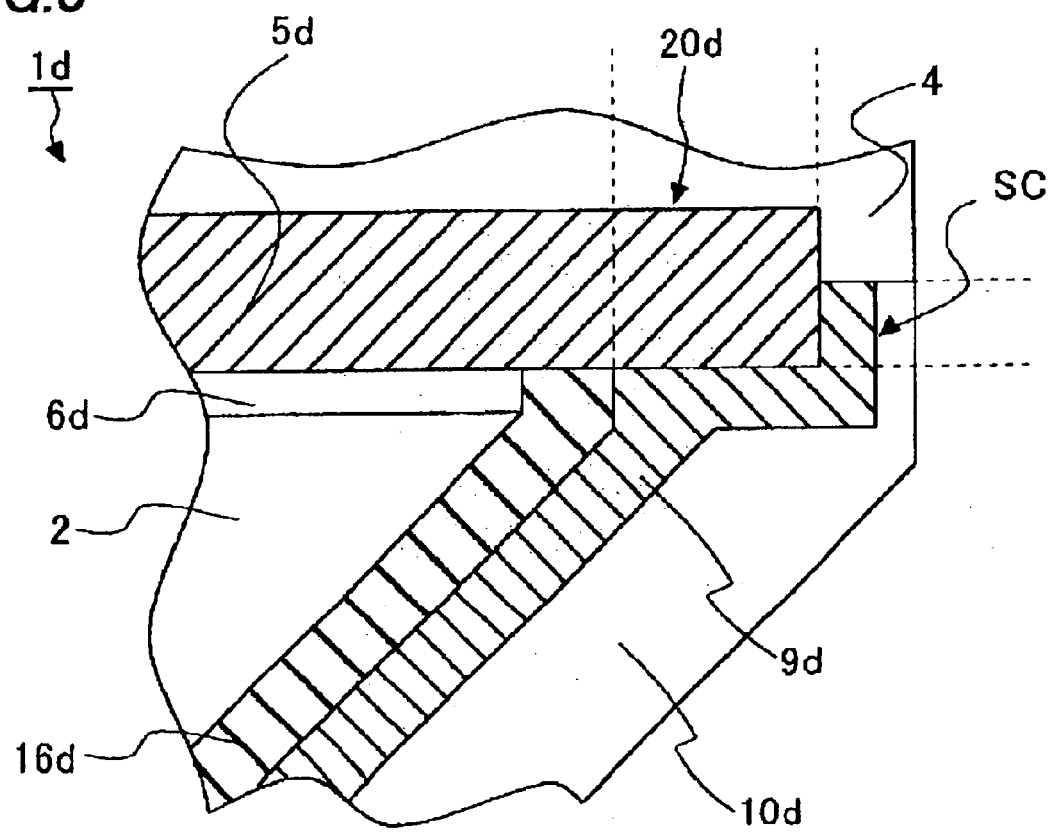
FIG. 3 is a cross-sectional view showing a semiconductor device according a fourth embodiment of this invention.

The same symbols are assigned to the same components in FIG. 3 as in FIG. 1, and explanations on them are omitted.

In addition to providing a first wiring 5d with a protruding portion 20d so that a contacting portion between the first wiring 5d and a second wiring 9d is formed wide, providing a side contacting portion (hereafter referred to as SC) where the second wiring 9d contacts with a side surface of the first wiring 5d further improves the electrical and mechanical connection between the first wiring 5d and the second wiring 9d in this embodiment.

That is, the second wiring 9d contacts the side surface of the first wiring 5d in addition to the contacting area formed wide to have 4 μm to 6 μm of the length of the contacting portion between the back surface of the first wiring 5d and the second wiring 9d. The second wiring 9d may contact entire side surface of the first wiring 5d. The length of the contacting portion between the back surface of the first wiring 5d and the second wiring 9d is preferably longer than the length of the side surface of the first wiring 5d.

In the first and the second embodiments, each of the second wirings 9a and 9b may contact either a portion of or entire side surface of each of the first wirings 5a and 5b, respectively.

Next, a manufacturing method according to the first embodiment of this invention will be explained referring to FIG. 4 through FIG. 8B.

Figure 4:
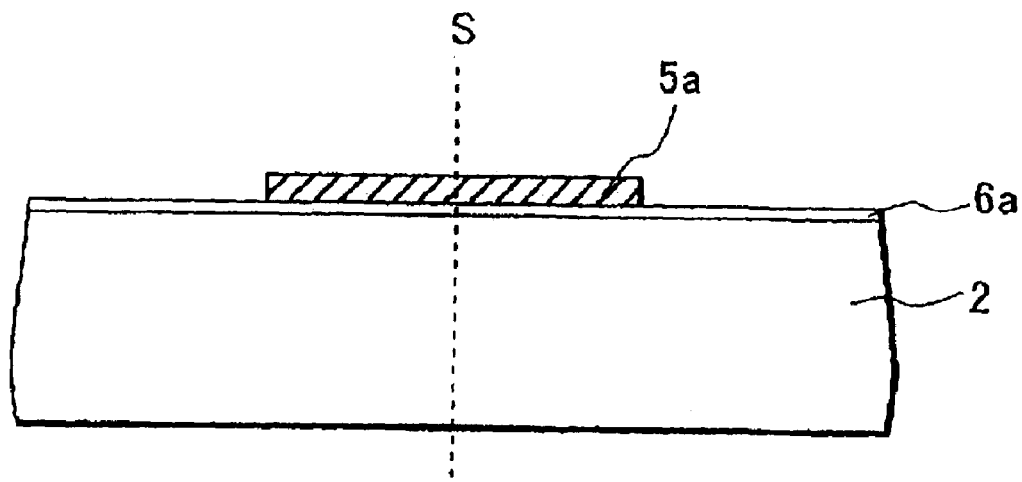
FIGS. 4, 5, 6, 7A, 7B, 8A and 8B show process steps for manufacturing the semiconductor device of the first embodiment.

First, a semiconductor wafer having a plurality of semiconductor dice 2 is provided, as shown in FIG. 4. The semiconductor dice 2 are CCD image sensors dice, for example. Then the first wiring 5a is formed over the semiconductor die 2 through the insulation film 6a across the border (dicing line) S.

After that, the glass substrate 3 is bonded on the surface of the insulation film 6a on the semiconductor die 2, using the transparent epoxy resin 4. The glass substrate 3 functions as a holding substrate for the semiconductor die 2. After back grinding the back surface of the semiconductor die 2 to reduce the thickness of the die, the semiconductor die 2 and the insulation film 6a are etched from the backside of the semiconductor die along the border S to expose a portion, preferably a central portion, of the back surface of the first wiring 5a. The back grinding is not a necessarily required process in this embodiment, and may be replaced by, for example, the etching through the thickness of the wafer.

Cost reduction is possible with this manufacturing process, since it does not have a glass substrate on the backside of the semiconductor die 2, which is required with the conventional art. Number of the manufacturing process steps is reduced, and the semiconductor device itself is made thinner.

Figure 6:
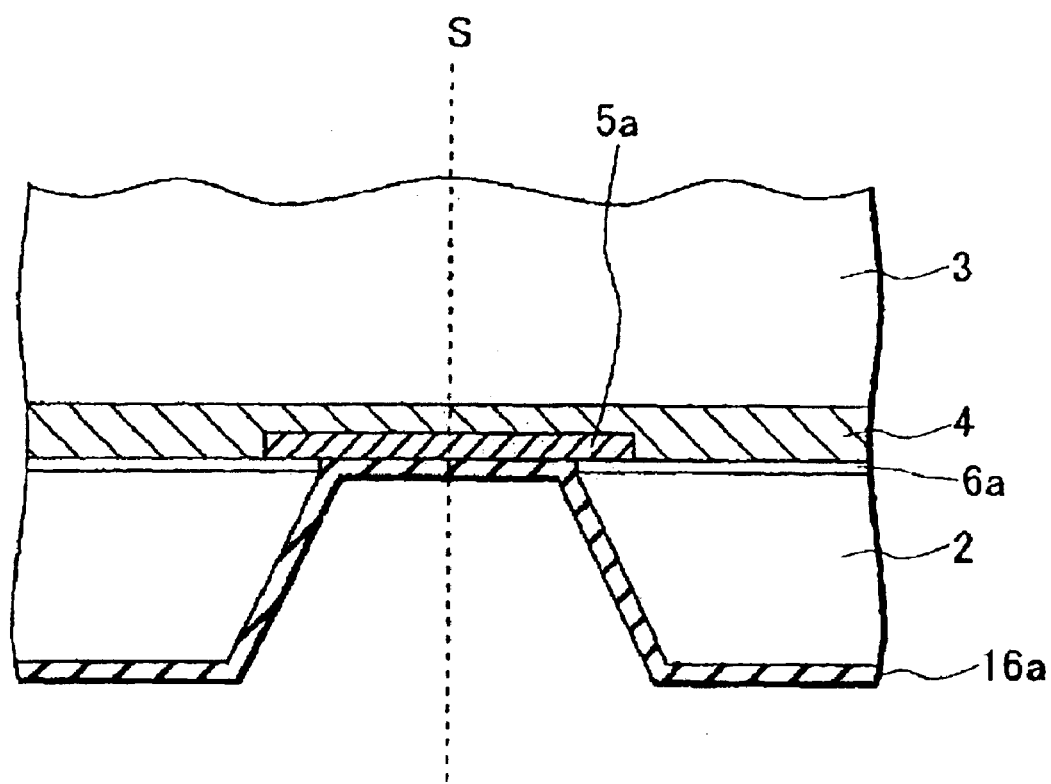

Then, the insulation film 16a is formed to cover the etched side surface of the semiconductor die 2 and the exposed portion of the first wiring 5a, as shown in FIG. 6. The insulation film 16a is, for example, a silicon dioxide ($SiO_2$) film or a silicon nitride (SiN) film formed by CVD (Chemical Vapor Deposition), or an organic insulation film such as polyimide. The insulation film 16a is about 2 μm thick.

Figure 7A:
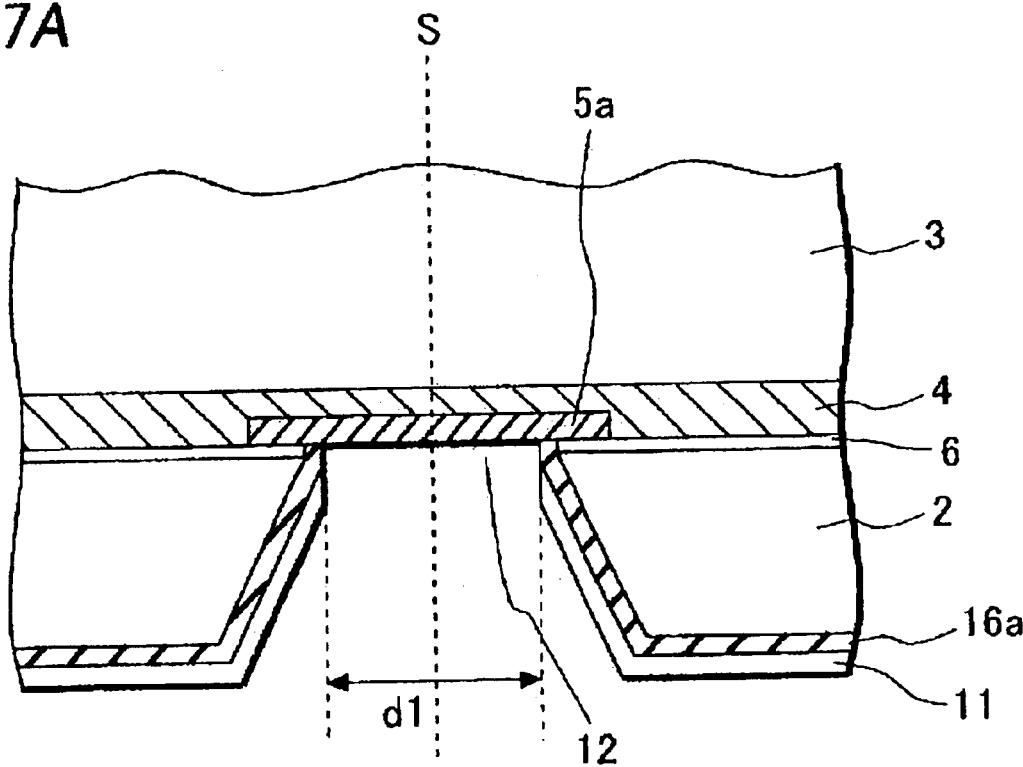

Next, a photoresist 11 is coated on a surface of the insulation film 16a followed by exposure and development processes, and an anisotropic etching is made on the insulation film 16a using the photoresist 11 as a mask, as shown in FIG. 7A. An opening 12 with a width of d1 centered around the border S is made in the insulation film 16a to expose the central portion of the first wiring 5a.

Figure 7B:
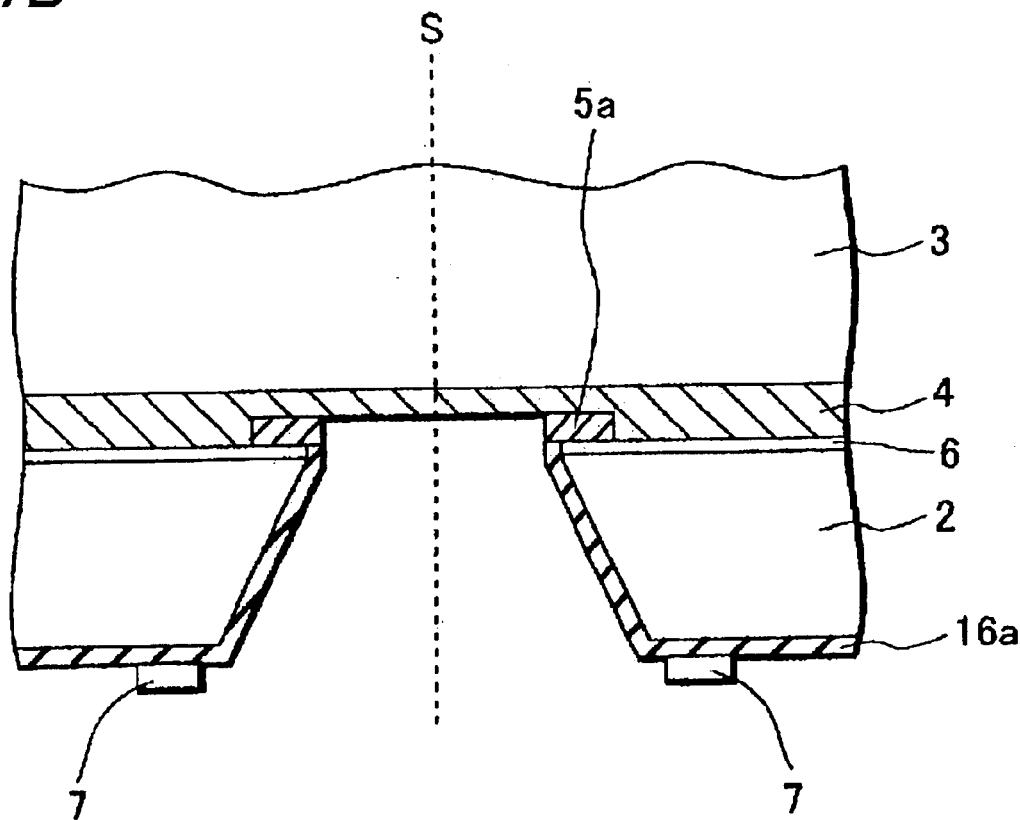

After that, another anisotropic etching is made using the photoresist 11 and the insulation film 16a as a mask, to sever the first wiring 5a in two by completely etching the exposed portion of the first wiring 5a, as shown in FIG. 7B. Side surfaces of the separated first wirings 5a are thus exposed.

The etching is done twice to etch the insulation film 16a and the first wiring 5a in the above explanation. However, the insulation film 16a and the first wiring 5a can also be etched continuously using the same etching gas.

After removing the photoresist 11, a plurality of cushions 7 is formed on desired locations on the insulation film 16a on the backside of the semiconductor die 2. Only one cushion 7 is shown on the semiconductor die 2 in the figure for the sake of simplicity. This cushion 7 is disposed at a location where the conductive terminal 8 is to be formed.

Figure 8A:
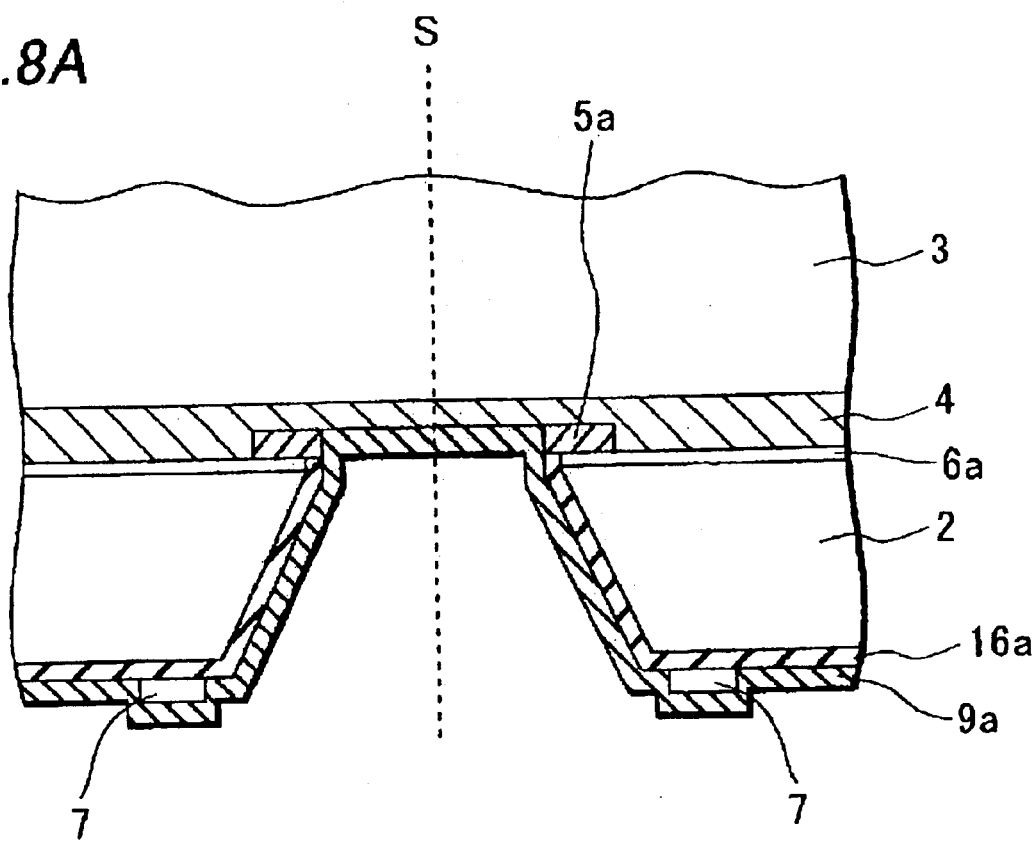

A metal layer is formed to cover entire back surface of the semiconductor die 2 by sputtering aluminum, aluminum alloy or copper, as shown in FIG. 8A.

Figure 8B:
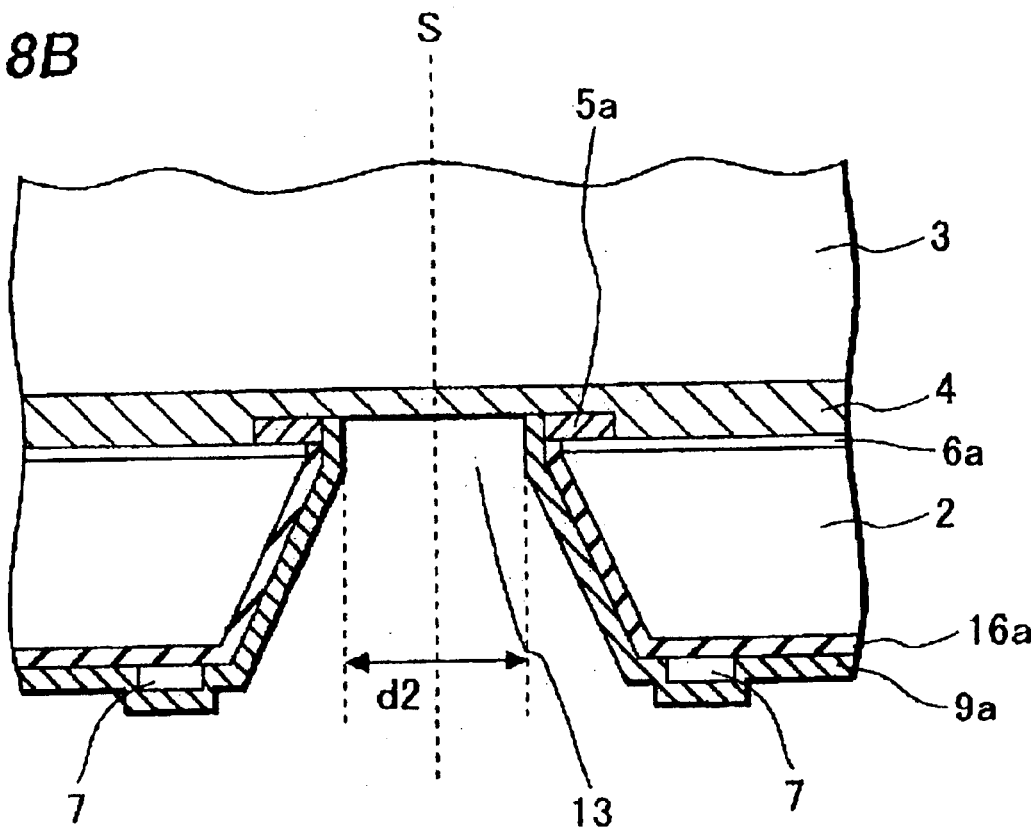

As shown in FIG. 8B, a photoresist (not shown) is applied on the metal layer, and exposure and development of the photoresist are made. Using the photoresist as a mask, the metal layer is etched to expose the resin 4 and form an opening 13 with a width of d2, which is smaller than the width d1 of the opening 12 (d1>d2). The second wiring 9a contacts the side surface of the first wiring 5a, and both of them are connected electrically and mechanically. The second wiring 9a is formed to be about 2 μm to 3 μm thick. The length of contacting portion between the first wiring 5a and the second wiring 9a is about 2 μm to 3 μm as described above. Nickel and gold are plated on the second wiring 9a.

Then the protection film 10a, such as a solder mask, is formed on the Ni—Au plating placed on the second wiring 9a, and solder is applied through the opening in the protection film 10a by means of screen printing, for example, to form the conductive terminal 8 on the Ni—Au plating placed on the second wiring 9a, as shown in FIG. 1A. Dicing along the borders S follows. With this, the BGA type semiconductor device 1a according to the first embodiment of this invention and shown in FIG. 1A is completed.

Figure 5:
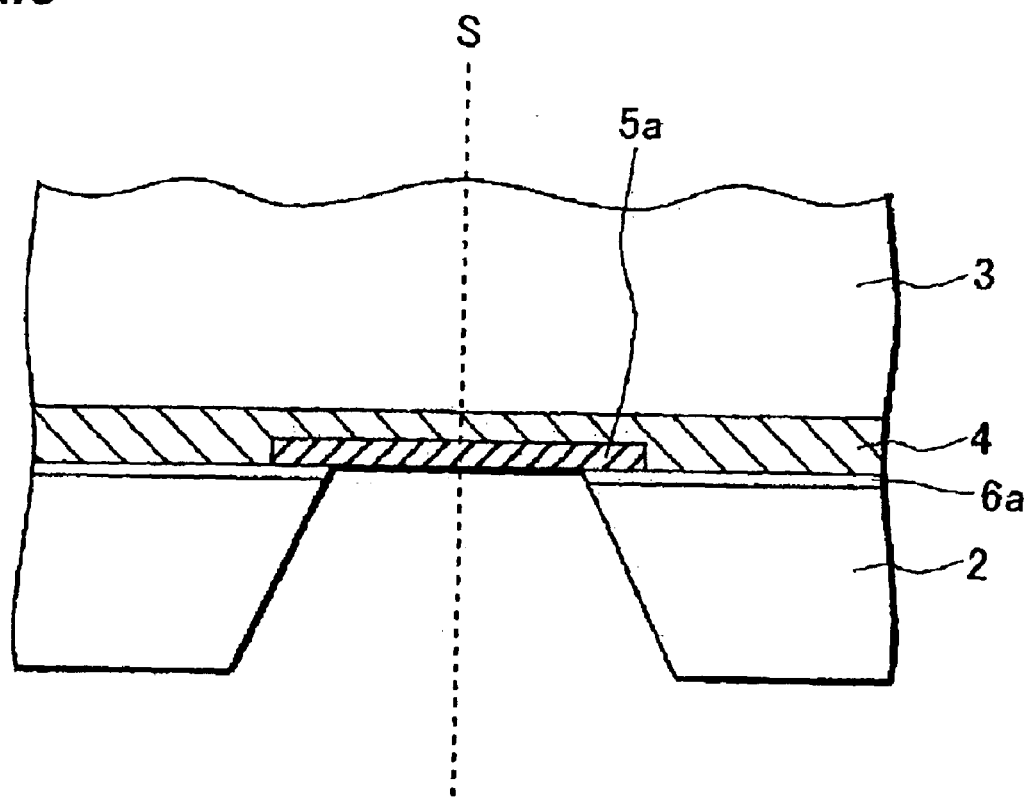

Next, a manufacturing method according to the second embodiment of this invention will be explained referring to FIG. 9A, FIG. 9B and FIG. 10. Since process steps corresponding to FIG. 4, FIG. 5 and FIG. 6 are common to the first and the second embodiments, process steps after these steps will be explained.

Figure 9A:
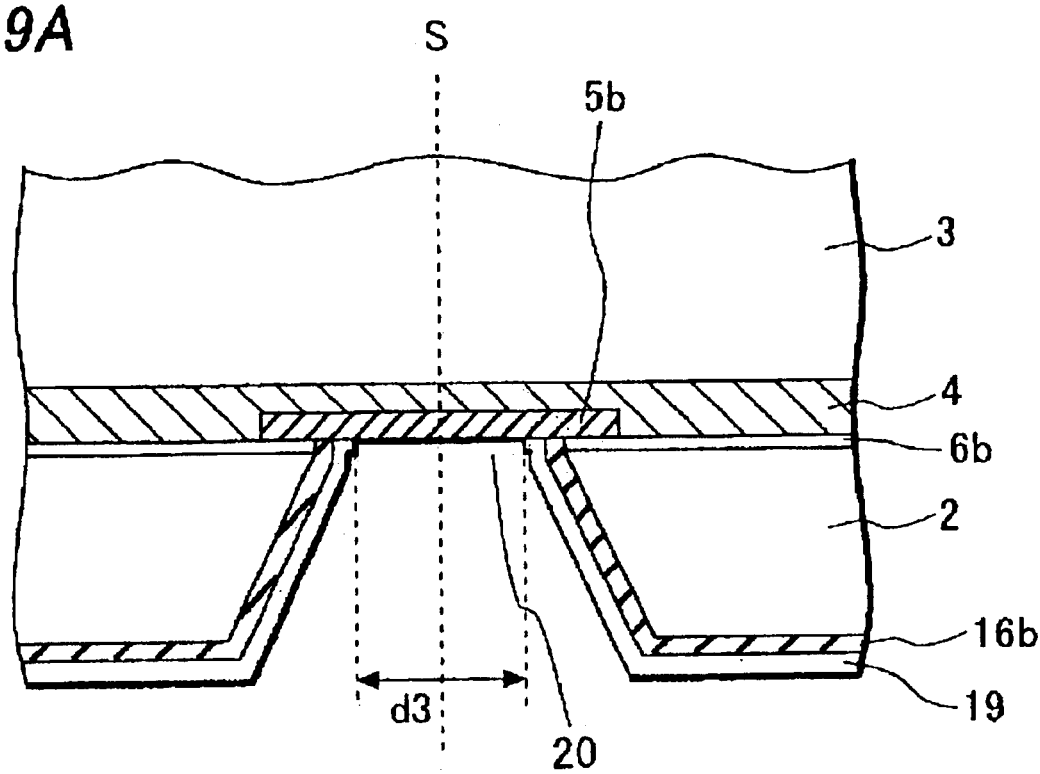
FIGS. 9A, 9B and 10 show process steps for manufacturing the semiconductor device of the second embodiment.

A photoresist 19 is applied on the backside of the semiconductor die 2, followed by exposure and development processes on it, and an opening 20 having a width of d3 is formed, as shown in FIG. 9A.

Figure 9B:
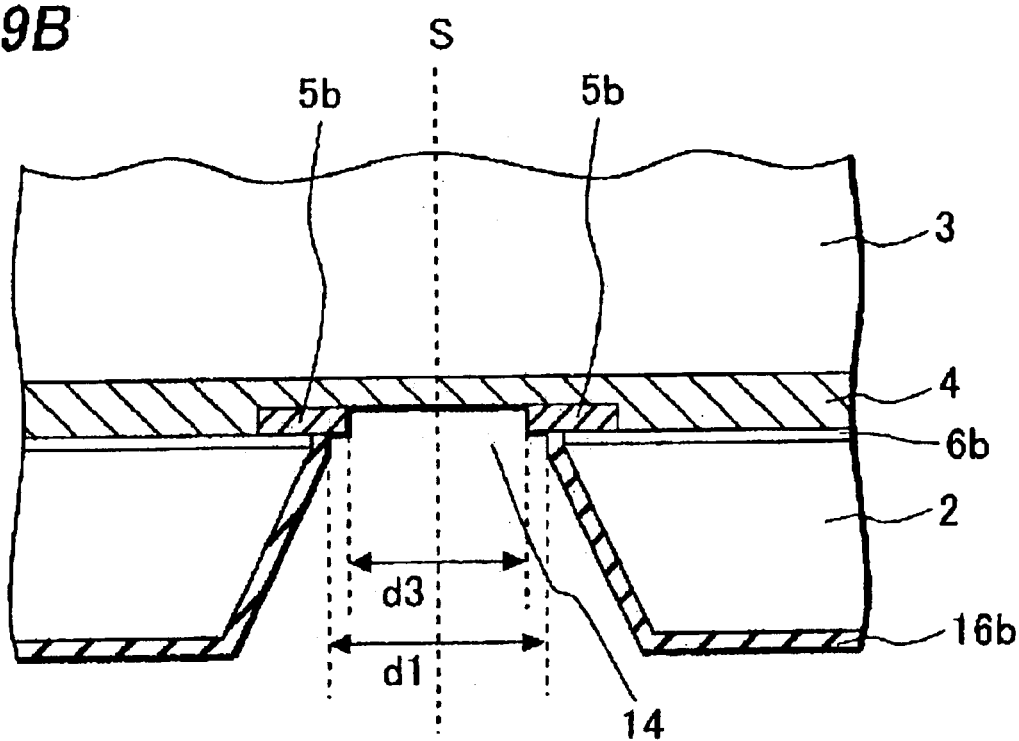

Using the photoresist 19 as a mask, the first wiring 5b is etched and severed in two, forming an opening 14 having the width of d3, as shown in FIG. 9B. Then the photoresist 19 is removed. Note that the width d3 of the opening 14 in FIG. 9B is smaller than the width d1 of the opening 12 in FIG. 7A.

Figure 10:
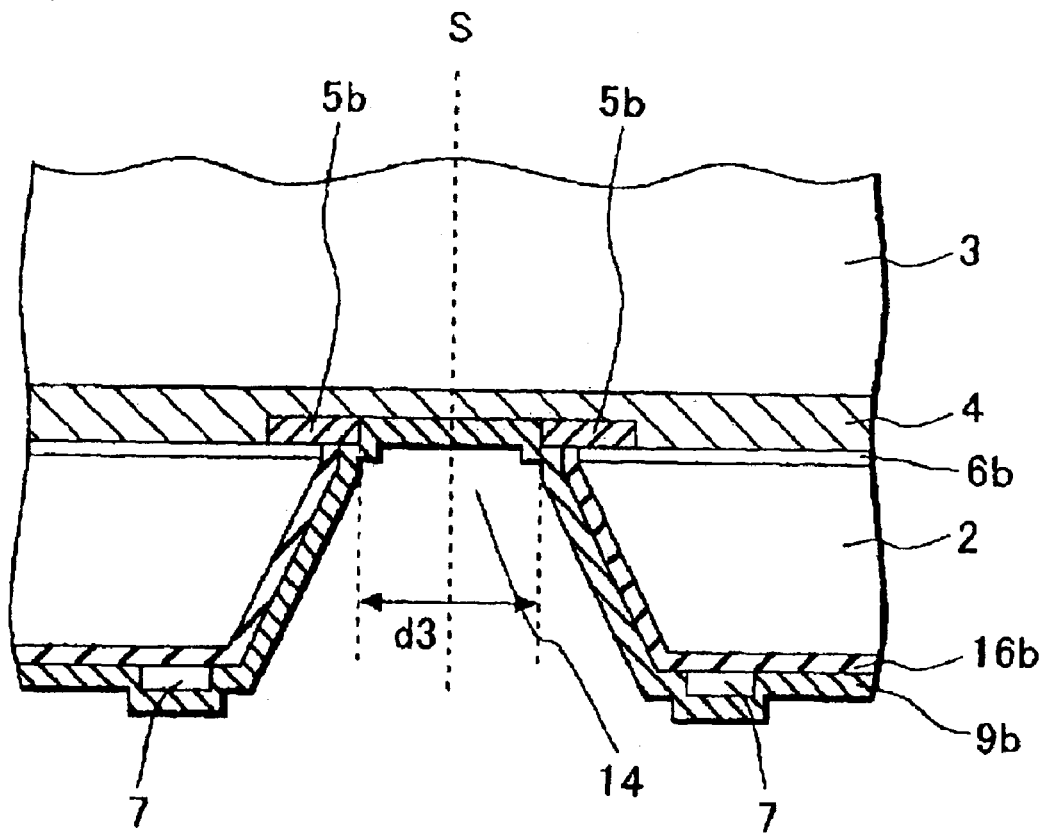
Figure 11:
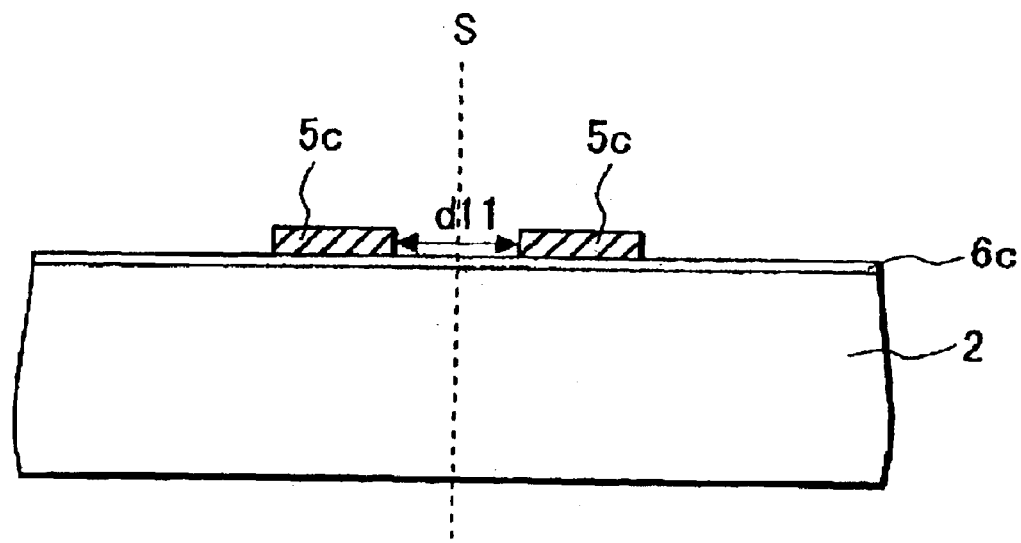
FIGS. 11, 12, 13, 14A, 15 and 16 show process steps for manufacturing the semiconductor device of the third embodiment.

After forming the cushion 7 at a predetermined location on the insulation film 16b, the second wiring 9b is formed on a surface of the insulation film 16b, on the part of the back surface and the side surface of the first wiring 5b, on the exposed surface of the resin 4 and on the cushion 7, as shown in FIG. 10.

Then a photoresist (not shown) is formed, followed by exposure and development processing, and the second wiring 9b is etched to form an opening having the same width d3 as the opening 14. With this, as shown in FIG. 1B, the part of the back surface of the first wiring 5b and the second wiring 9b make the contacting portion of 2 μm to 3 μm in length, and are electrically connected. The second wiring 9b is formed to be about 2 μm to 3 μm thick. Nickel and gold are plated on the second wiring 9b.

Then the protection film 10b is formed on the Ni—Au plating placed on the second wiring 9b, and solder is applied to the opening formed at a predetermined location in the protection film 10b by means of screen printing, for example, to form the conductive terminal 8 on the Ni—Au plating placed on the second wiring 9b. After that, the dicing is performed along the borders S between the semiconductor dice 2. With this, the BGA type semiconductor device 1b according to the second embodiment of this invention and shown in FIG. 1B is completed.

Since the manufacturing method of the first and the second embodiments described above does not include the notching used in the conventional art, the first wirings 5a, 5b do not have rough surface at the end, and can be kept clean. As a result, the adhesion between the first wirings 5a, 5b and the second wirings 9a, 9b is improved.

In the manufacturing method of the first and the second embodiments, each of the second wirings 9a and 9b is formed by first sputtering over the wide area, and then severing it in two by etching. By doing so, the electrical and mechanical connectivity between the first wirings 5a, 5b and the second wirings 9a, 9b is improved, even though the contacting portion between them has the same length of 2 μm to 3 μm as in the conventional art.

Although the first wirings 5a, 5b are connected with the corresponding second wirings 9a, 9b after it is severed in two by etching in the manufacturing method of the first and the second embodiments described above, the first wirings 5a, 5b and the second wirings 9a, 9b can be severed by etching after the first wirings 5a, 5b and the second wirings 9a, 9b are connected, respectively.

Next, a manufacturing method according to the third embodiment of this invention will be explained referring to FIG. 11 through FIG. 16.

A semiconductor wafer having a plurality of semiconductor dice is provided, and a couple of the first wirings 5c are formed on the semiconductor dice 2 through the insulation film 6c across the border S between the semiconductor dice 2 with a clearance d11. The first wirings 5c are part of a top layer wiring structure of the semiconductor dice 2, for example.

Figure 12:
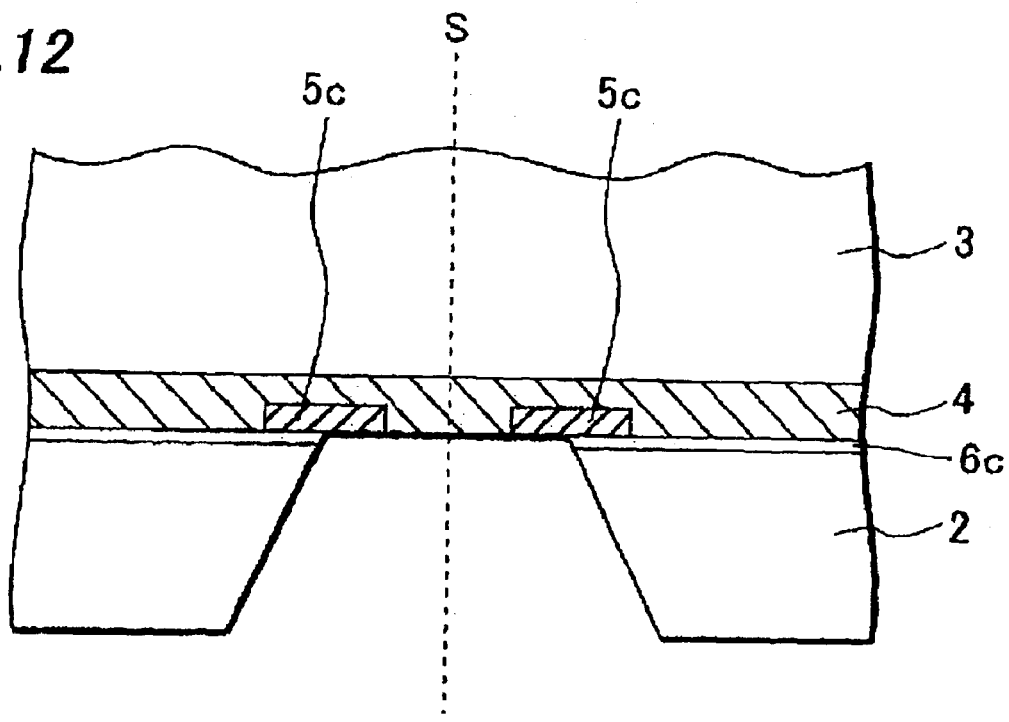

After that, a transparent epoxy resin 4 is applied over the semiconductor dice 2 through the first wirings 5c and the insulation film 6c, as shown in FIG. 12. A glass substrate 3 is bonded on the surface of the semiconductor dice 2, using the resin 4 as a binder.

After back grinding the semiconductor dice 2 to reduce the thickness of the dice, the semiconductor dice 2 and the insulation film 6c are etched from the backside of the semiconductor dice along the border S to expose a portion of the first wirings 5c and a portion of the resin 4. The back grinding is not a necessarily required process in this embodiment.

Figure 13:
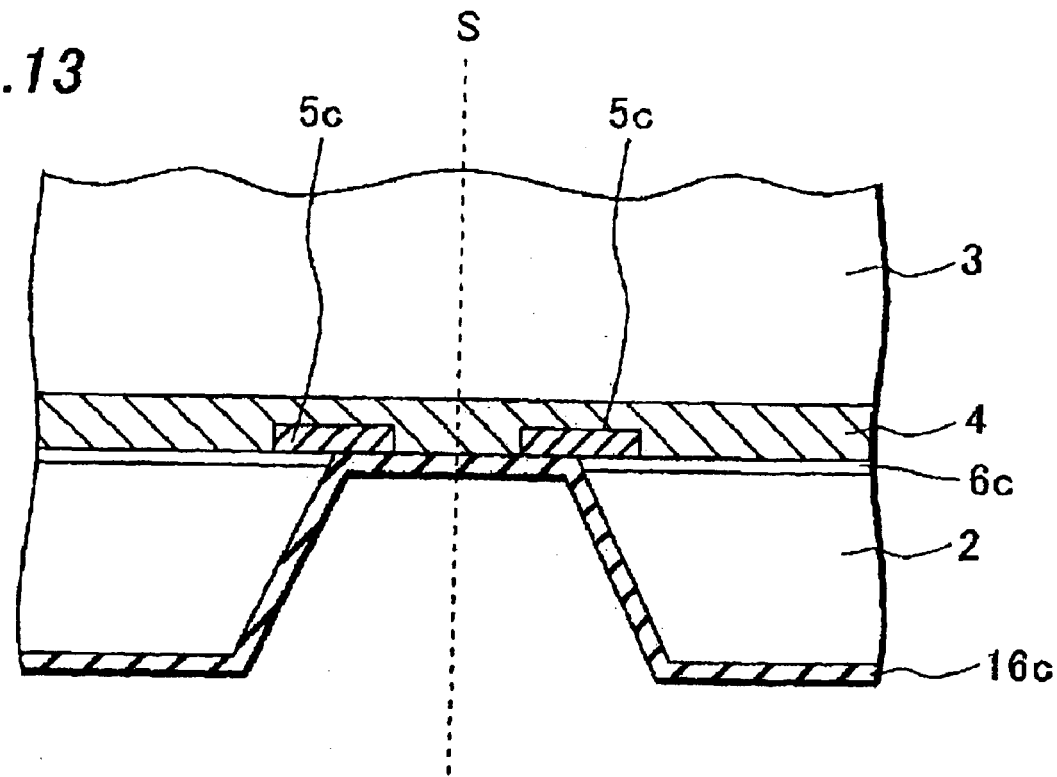

Next, the insulation film 16c is formed by CVD on the back surface of the semiconductor dice 2, an etched side surface of the semiconductor dice 2, a side surface of the insulation film 6c, the first wirings 5c and exposed resin 4, as shown in FIG. 13.

Figure 14A:
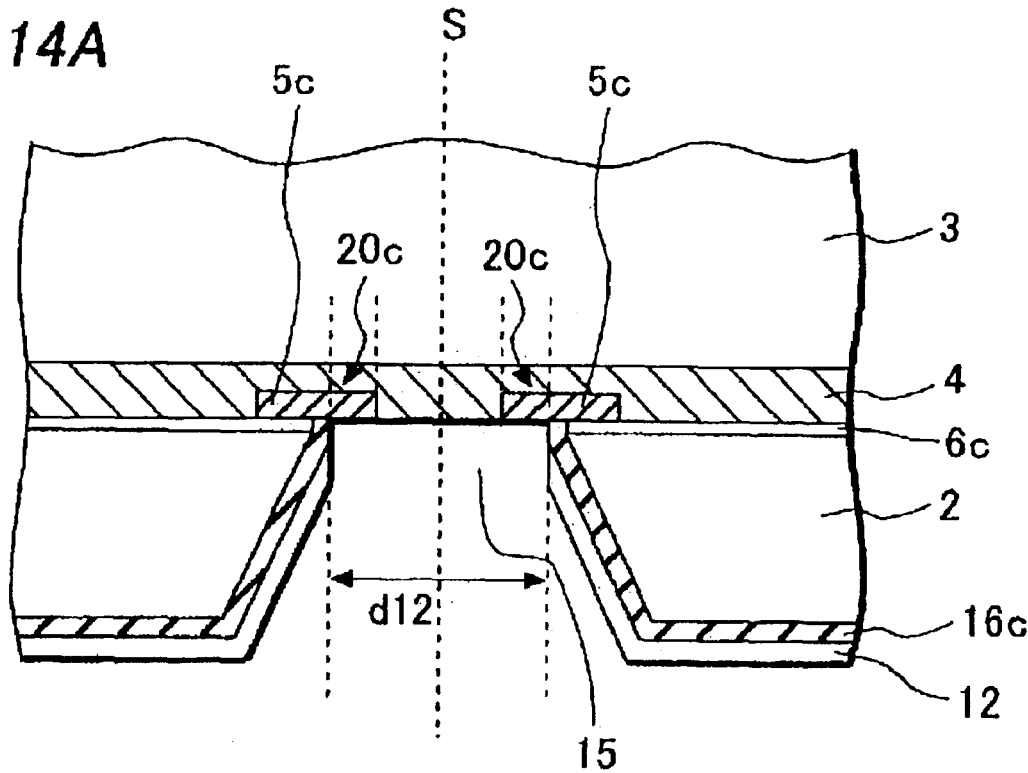

Next, a photoresist 12 is applied on a surface of the insulation film 16c, followed by exposure and development processes, and an anisotropic etching is made on the insulation film 16c using the photoresist 12 as a mask to form an opening 15 in the insulation film 16c, as shown in FIG. 14A. Exposed surfaces of the first wirings 5c in the opening 15 are called protruding portions 20c. A width d12 of the opening 15 is formed to be wider than the clearance d11 between the first wirings 5c. The border S is located at about a center of the opening 15.

Figure 15:
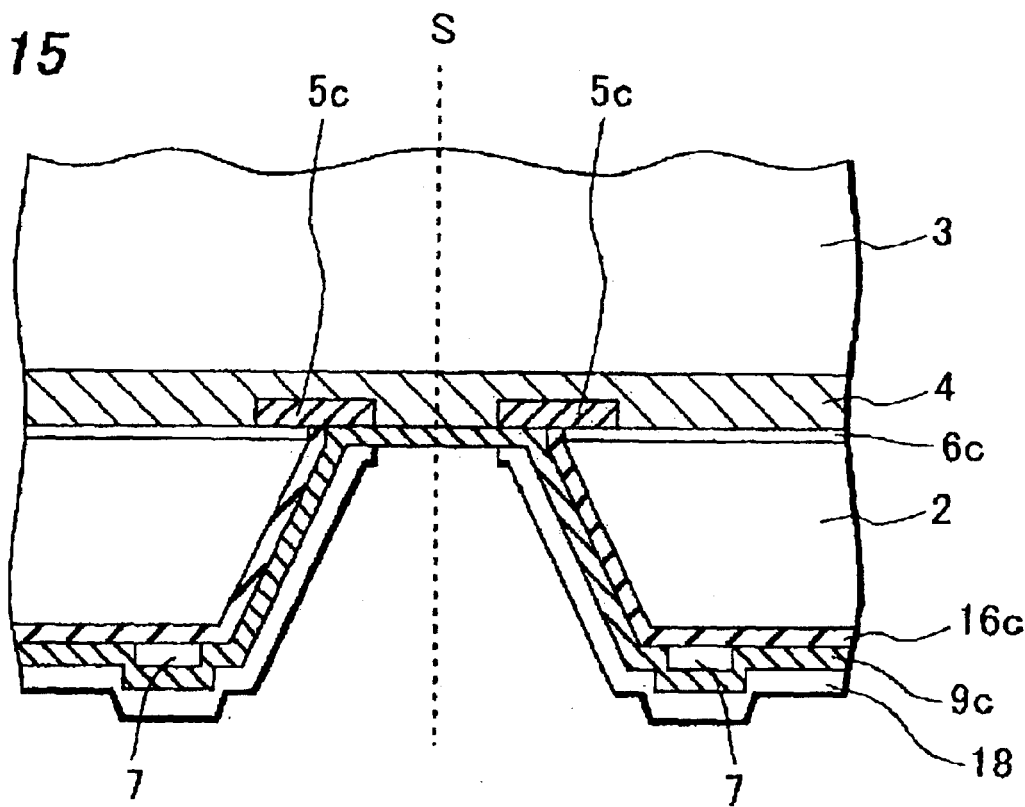

After removing the photoresist 12, cushions 7 are formed on the insulation film 16c, as shown in FIG. 15. After that, a metal layer consisting of aluminum, aluminum alloy or copper is formed by sputtering on the surface of the insulation film 16c, the surface of the cushions 7, the exposed surface of the first wirings 5c and the exposed surface of the resin 4. A photoresist 18 is applied on the metal layer, followed by exposure and development processes.

Figure 16:
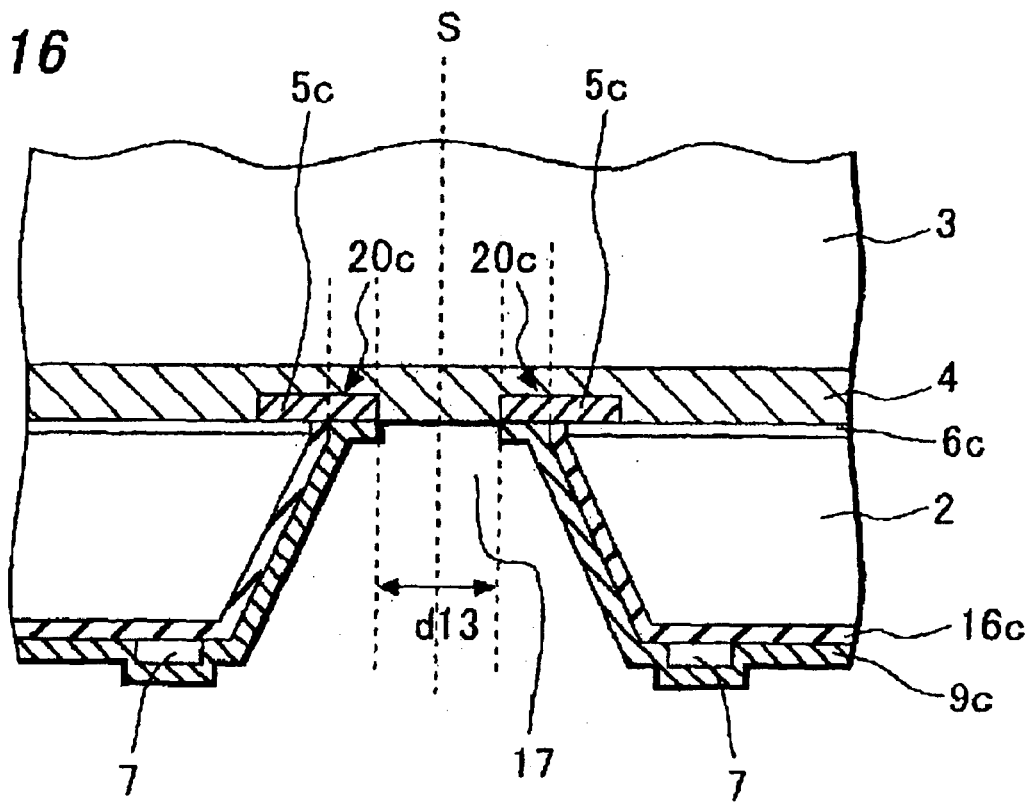
Figure 17:
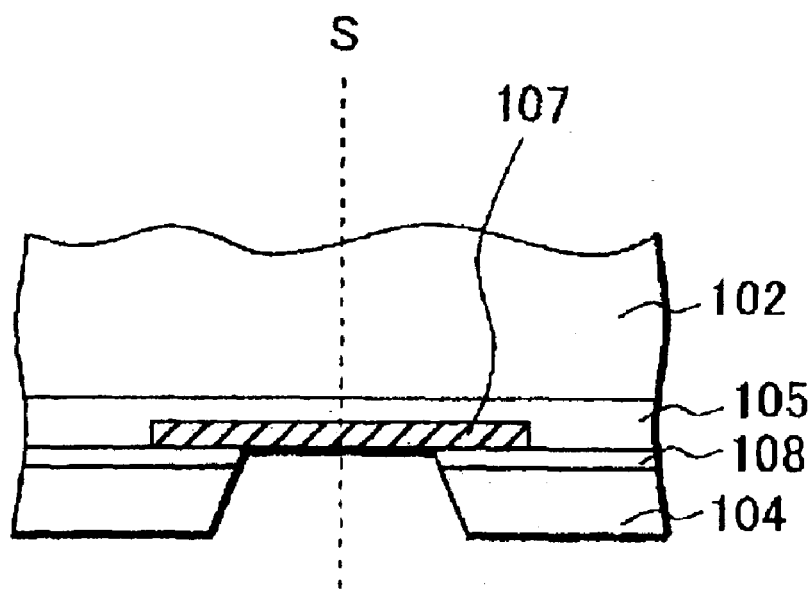
FIGS. 17, 18 19 and 20 show process steps for manufacturing a conventional semiconductor device.
Figure 18:
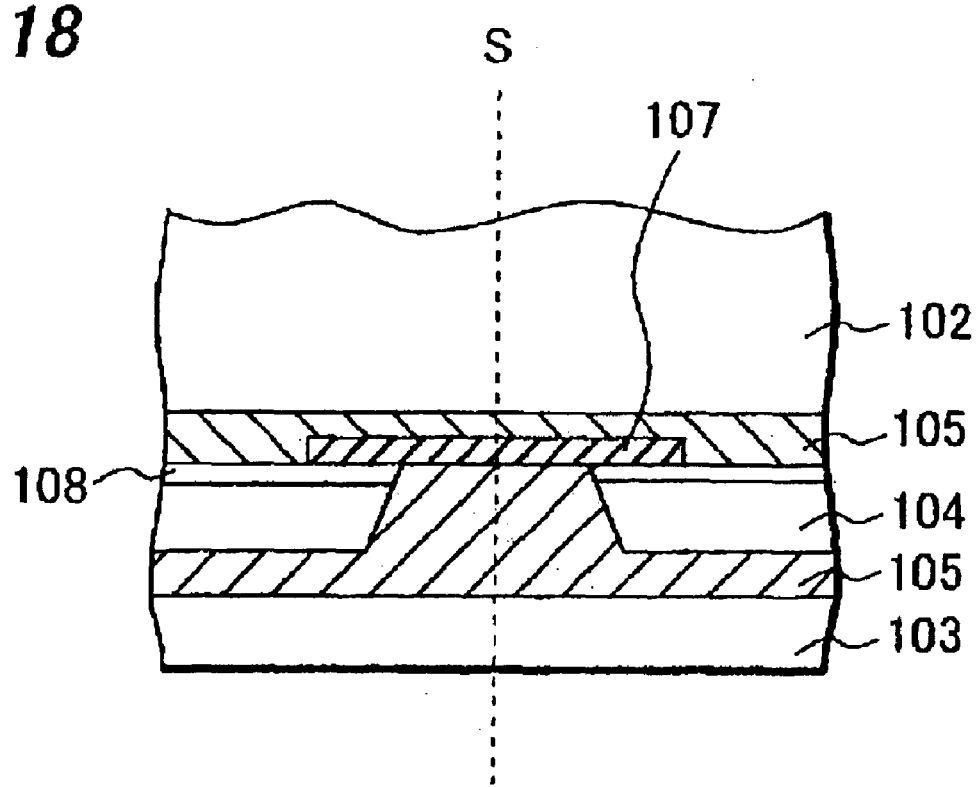
Figure 19:
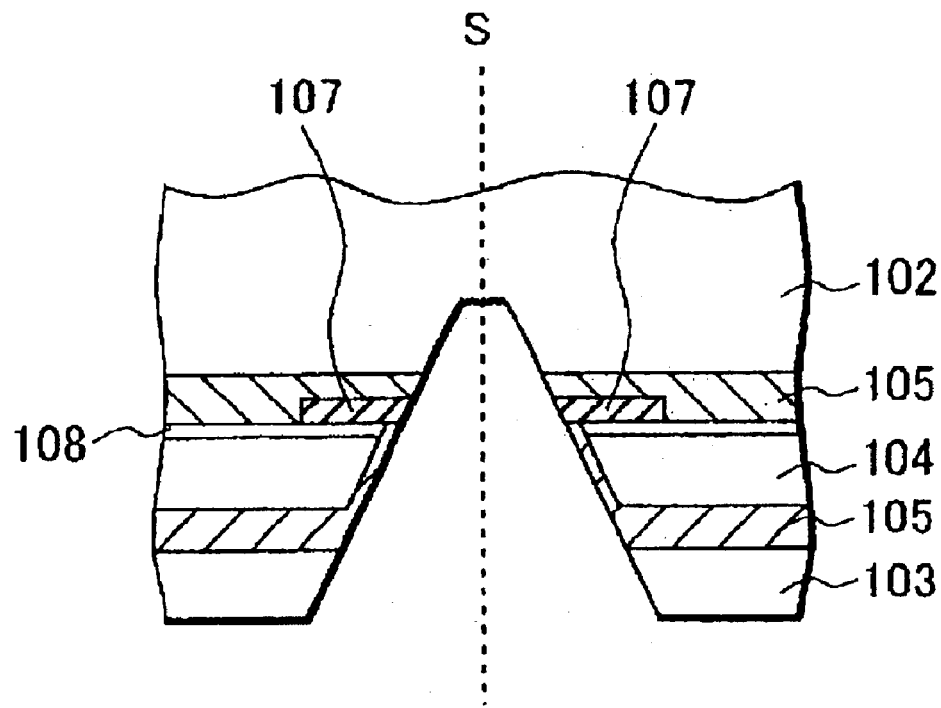
Figure 20:
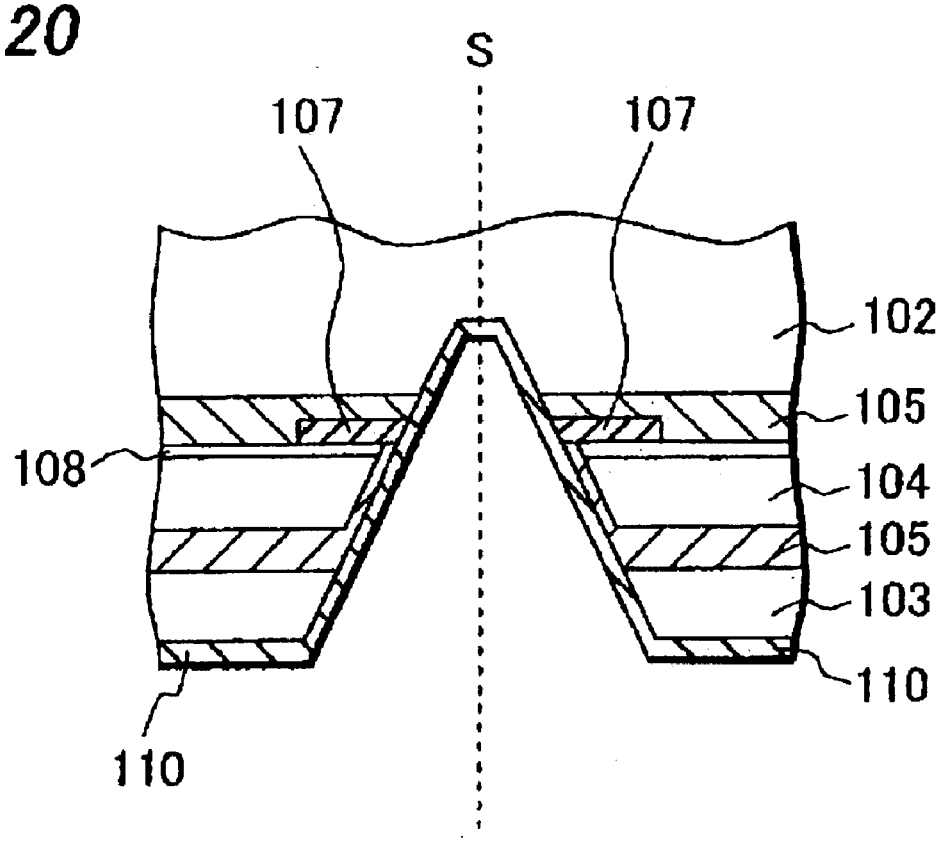

The metal layer is etched using the photoresist 18 as a mask to form an opening 17, as shown in FIG. 16. A width d13 of the opening 17 is smaller than the width d12 of the opening 15 shown in FIG. 14A and FIG. 14B, and is equal to the clearance d11. In other words, a side surface at an end of the protruding portion 20c coincides with a side surface at an end of the second wiring 9c.

Then after undergoing the same process steps as the manufacturing method according to the first embodiment, the semiconductor device 1c of this embodiment as shown in FIG. 2 is completed.

In this embodiment, the back surface of the protruding portions 20c of the first wirings 5c is exposed by forming the opening 15 having the width d12 which is wider than the clearance d11 between the couple of the first wirings 5c. And the protruding portion 20c and the back surface of the second wiring 9c make a wide contacting area, the length of which is 4 µm to 6 µm, for example. The adhesion would further increase if the contacting area has a length of more than 6 µm.

Next, a manufacturing method according to the fourth embodiment of this invention will be explained referring to FIG. 14B.

In this embodiment, the etching process described in the third embodiment referring to FIG. 14A is further modified.

Figure 14B:
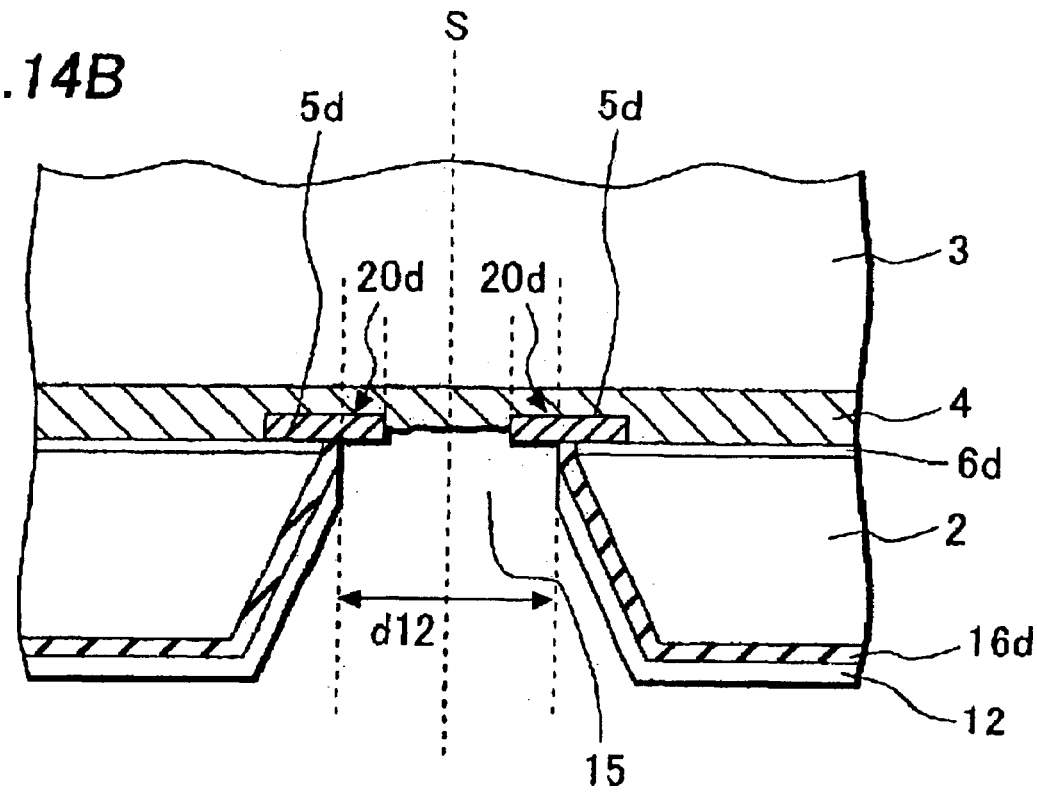
FIG. 14B shows a process step for manufacturing the semiconductor device of the fourth embodiment.

FIG. 14B is a cross-sectional view showing a step of partially etching the resin between the wirings 5d. The etching step shown in FIG. 14A continues to etch through the mask 12 the resin 4 between the couple of separated first wirings 5d. This etching is either wet etching or dry etching, using an etchant which does not etch the first wirings 5d.

As a result, a portion of or entire side surface of the first wirings 5d is exposed. After that, by removing the photoresist 12 and applying the same process steps as in the third embodiment, the semiconductor device 1d in which the second wiring 9d contacts the back surface and the side surface of the first wirings 5d as shown in FIG. 3 is completed.

A plate made of a plastic can be used replacing the glass substrate 3 in the first, second, third and fourth embodiments described above. However, the plate needs to be transparent when the semiconductor die 2 is a CCD image sensor.

As another modification, a film, a silicon substrate, a reclaimed silicon substrate, an oxide film or a transparent resin may be used instead of the glass substrate 3. The film material is made of an organic film material, and is bonded on the first wiring 5a, 5b, 5c or 5d, through the resin. The film has advantage of reduced cost and no fracturing at the dicing over the glass substrate 3. The reclaimed silicon substrate does not need to be a pure silicon substrate, because it is used as a holding substrate. The reclaimed silicon substrate has advantage of reduced cost. The silicon substrate as well as the reclaimed silicon substrate is bonded on the first wiring 5a, 5b, 5c or 5d, through the resin. The oxide film is formed by low temperature CVD or by plasma CVD on the first wiring 5a, 5b, 5c or 5d without resin. The transparent resin, for example an insulation film consisting of transparent epoxy material or transparent polyimide material, is formed on the first wiring 5a, 5b, 5c or 5d to have a thickness of 100 µm or greater, using screen printing. Each of the film, the silicon substrate, the reclaimed silicon substrate, the oxide film and the transparent resin material is formed to have enough thickness enough to function as the holding substrate. An oxide film or a nitride film is formed as a protection film on the first wiring 5a, 5b, 5c or 5d, in advance.

The BGA type semiconductor device can be obtained at reduced cost according to these embodiments, since only one substrate supports the semiconductor device. Also, a better electric connection between the semiconductor die and the conductive terminal formed on the holding substrate is obtained.

What is claimed is:

1. A semiconductor device comprising;
   a semiconductor die;
   a first insulation film disposed on a top surface of the semiconductor die;
   a first wiring portion disposed on the first insulation film;
   an inorganic holding substrate disposed over the top surface of the semiconductor die;
   a separate resin layer attaching the holding substrate to the top surface of the semiconductor die;
   a second insulation film comprising a side film and a back film, the side film being disposed on a side surface of the semiconductor die and the back film being disposed on a back surface of the semiconductor die;
   a second wiring portion disposed on the side film and the back film and connected to the first wiring portion; and
   a conductive terminal formed on the second wiring portion.

2. The semiconductor device of claim 1, wherein the second wiring portion is connected to a side surface of the first wiring portion, the side surface of the first wiring portion being aligned along the thickness direction of the first wiring portion.

3. The semiconductor device of claim 1, wherein the second wiring portion is connected to a back surface of the first wiring portion, the back surface of the first wiring portion facing the first insulation film.

4. The semiconductor device of claim 3, wherein a length of a contacting portion between the second wiring portion and the back surface of the first wiring portion is longer than a thickness of the first wiring portion.

5. The semiconductor device of claim 1, wherein the second wiring portion is connected to a back surface of the first wiring portion and a side surface of the first wiring portion, the side surface of the first wiring portion being aligned along the thickness direction of the first wiring portion and the back surface of the first wiring portion facing the first insulation film.

6. The semiconductor device of claim 5, wherein a length of a contacting portion between the second wiring portion and the back surface of the first wiring portion is longer than a thickness of the first wiring portion.

7. The semiconductor device of claim 1, further comprising a cushion disposed between the second wiring portion and the second insulation film.

8. The semiconductor device of claim 1, wherein the holding substrate is a glass plate, a silicon substrate or a reclaimed silicon substrate.

9. A semiconductor device comprising:

a semiconductor die;

a first insulation film disposed on a top surface of the semiconductor die;

a first wiring portion disposed on the first insulation film;

an inorganic holding substrate disposed over the top surface of the semiconductor die;

a separate resin layer attaching the holding substrate to the top surface of the semiconductor die;

a second insulation film disposed on a side surface and a back surface of the semiconductor die;

a second wiring portion disposed on the second insulation film and being in contact with part of a back surface of the first wiring portion, another part of the back surface of the first wiring portion being in contact with the first insulation film on the top surface of the semiconductor die; and a conductive terminal formed on the second wiring portion.

10. A semiconductor device comprising:

a semiconductor die;

a first insulation film disposed on a top surface of the semiconductor die;

a first wiring portion disposed on the first insulation film;

a holding substrate having a thickness of about 400 μm and attached to the top surface of the semiconductor die;

a second insulation film comprising a side film and a back film, the side film being disposed on a side surface of the semiconductor die and the back film being disposed on a back surface of the semiconductor die;

a second wiring portion disposed on the side film and the back film and connected to the first wiring portion; and a conductive terminal formed on the second wiring portion.

* * * * *

UNITED STATES PATENT AND TRADEMARK OFFICE
CERTIFICATE OF CORRECTION

PATENT NO.       : 7,312,521 B2                                             Page 1 of 1
APPLICATION NO.  : 10/420943
DATED            : December 25, 2007
INVENTOR(S)      : Takashi Noma et al.

Figure 21:
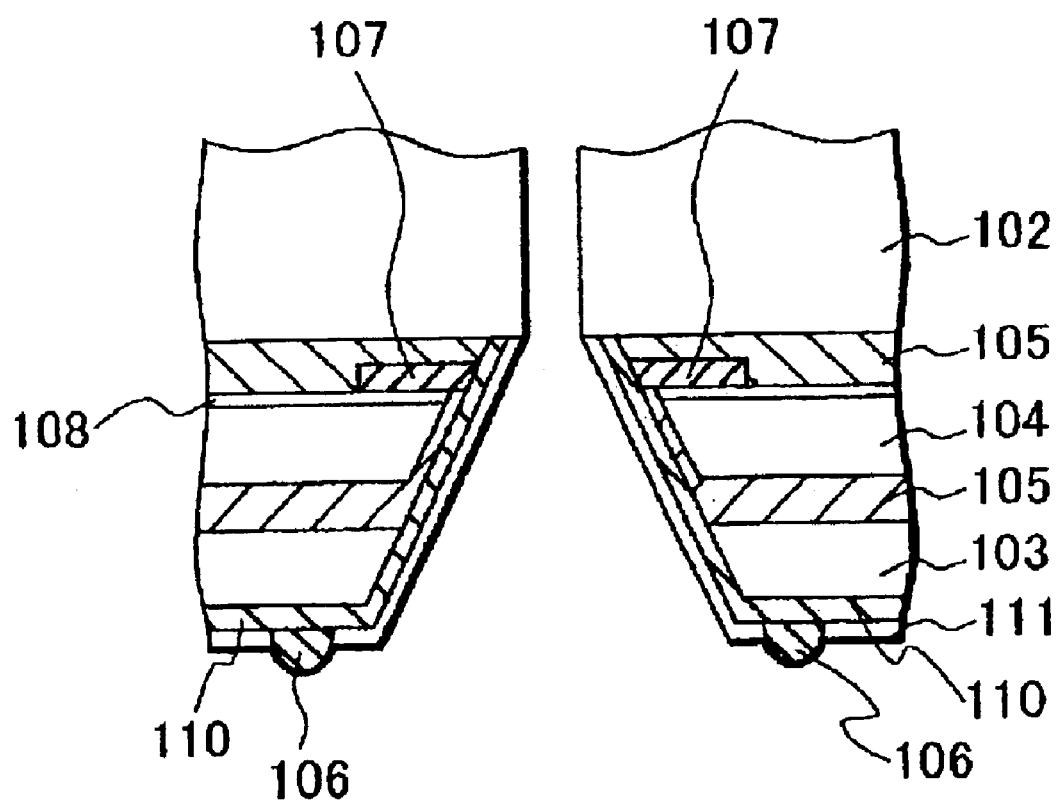
FIG. 21 is a cross-sectional view showing the conventional semiconductor device manufactured by the process steps of FIGS. 17–20.
Figure 22A:
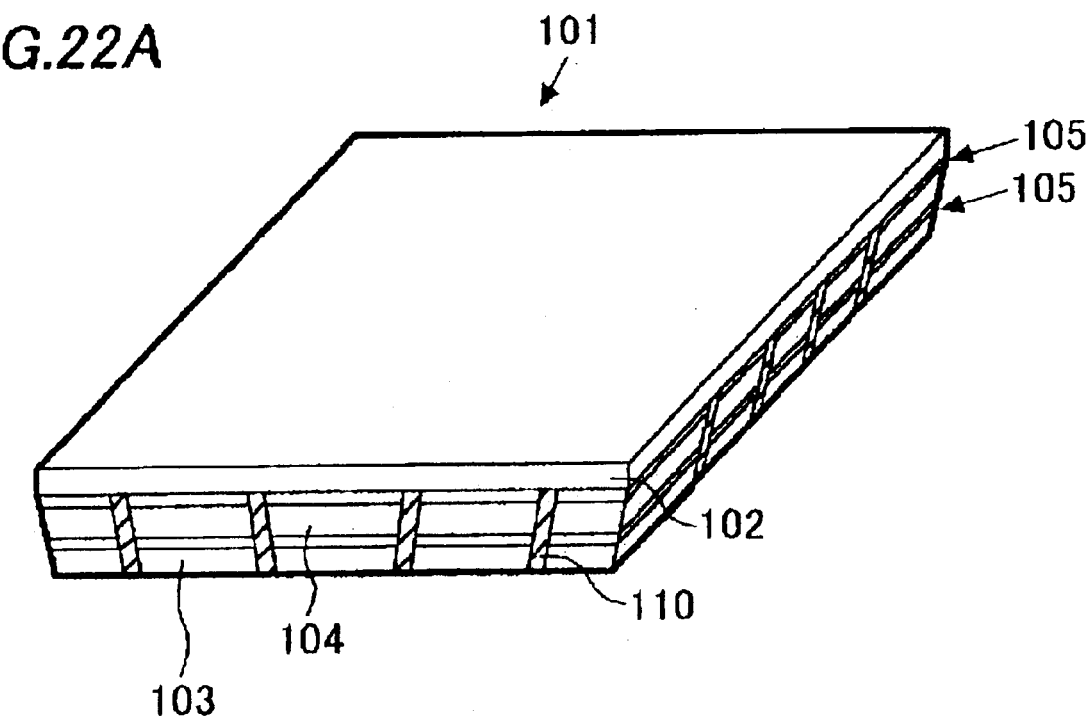
FIG. 22A and FIG. 22B are oblique perspective views showing the semiconductor device of FIG. 21.
Figure 22B:
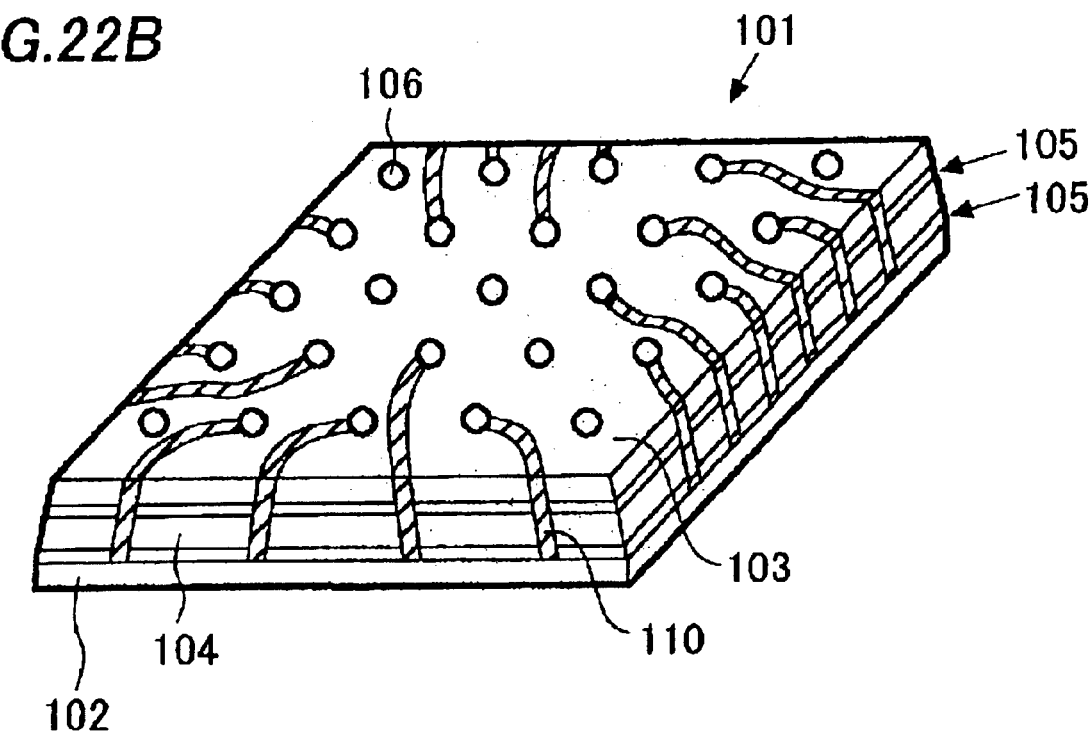

It is certified that error appears in the above-identified patent and that said Letters Patent is hereby corrected as shown below:

In the Drawings,

On Sheet 14, Fig. 21, delete:

" 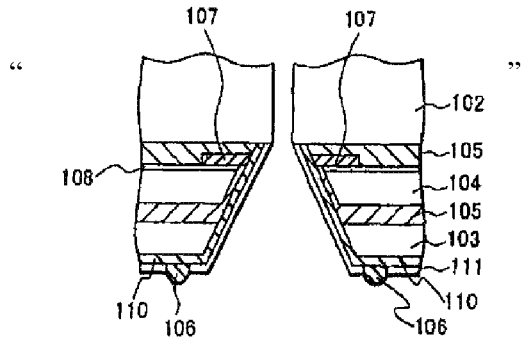 "

and replace with:

-- 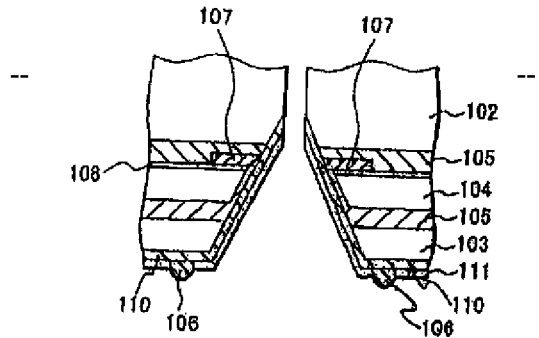 --

Signed and Sealed this

Twelfth Day of May, 2009

JOHN DOLL
*Acting Director of the United States Patent and Trademark Office*